(12) United States Patent
Mao et al.

(10) Patent No.: US 12,046,593 B2
(45) Date of Patent: Jul. 23, 2024

(54) SEMICONDUCTOR DEVICE AND MANUFACTURING METHOD THEREOF

(71) Applicant: INNOSCIENCE (SUZHOU) TECHNOLOGY CO., LTD., Suzhou (CN)

(72) Inventors: Danfeng Mao, Zhuhai (CN); King Yuen Wong, Zhuhai (CN); Jinhan Zhang, Zhuhai (CN); Xiaoyan Zhang, Zhuhai (CN); Wei Wang, Zhuhai (CN); Jianjian Sheng, Zhuhai (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 744 days.

(21) Appl. No.: 17/266,094

(22) PCT Filed: Dec. 25, 2020

(86) PCT No.: PCT/CN2020/139485
§ 371 (c)(1),
(2) Date: Feb. 4, 2021

(87) PCT Pub. No.: WO2022/134017
PCT Pub. Date: Jun. 30, 2022

(65) Prior Publication Data
US 2022/0375925 A1    Nov. 24, 2022

(51) Int. Cl.
*H01L 27/06* (2006.01)
*H01L 21/8252* (2006.01)
(Continued)

(52) U.S. Cl.
CPC ...... *H01L 27/0605* (2013.01); *H01L 21/8252* (2013.01); *H01L 23/3171* (2013.01);
(Continued)

(58) Field of Classification Search
None
See application file for complete search history.

(56) References Cited

U.S. PATENT DOCUMENTS 9,490,255 B1 * 11/2016 Edge .............. H01L 21/823842
10,153,273 B1   12/2018 Tsai et al.
(Continued)

FOREIGN PATENT DOCUMENTS

CN     105283958 A    1/2016
CN     106486543 A    3/2017
(Continued)

OTHER PUBLICATIONS

International Search Report and Written Opinion of the corresponding PCT application No. PCT/CN2020/139485 mailed on Sep. 26, 2021.

(Continued)

*Primary Examiner* — Michael Lebentritt
(74) *Attorney, Agent, or Firm* — JCIPRNET

(57) ABSTRACT

The present disclosure relates to a semiconductor device and a fabrication method thereof. The semiconductor device includes a substrate, a first nitride semiconductor layer disposed on the substrate, a second nitride semiconductor layer disposed on the first nitride semiconductor layer and having a bandgap greater than that of the first nitride semiconductor layer. The semiconductor device further includes a first gate conductor disposed on a first region of the second nitride semiconductor layer, a passivation layer covering the first gate conductor, and a second gate conductor disposed on the passivation layer and on a second region of the second nitride semiconductor layer, wherein the first region is laterally spaced apart from the second region.

20 Claims, 24 Drawing Sheets

(51) Int. Cl.
  *H01L 23/31*  (2006.01)
  *H01L 29/20*  (2006.01)
  *H01L 29/205*  (2006.01)
  *H01L 29/66*  (2006.01)
  *H01L 29/778*  (2006.01)
  *H01L 49/02*  (2006.01)

(52) U.S. Cl.
  CPC .......... *H01L 28/60* (2013.01); *H01L 29/2003* (2013.01); *H01L 29/205* (2013.01); *H01L 29/66462* (2013.01); *H01L 29/7786* (2013.01)

(56) References Cited

U.S. PATENT DOCUMENTS

| | | |
|---|---|---|
| 10,446,542 B1 | 10/2019 | Kinzer |
| 10,516,043 B1 | 12/2019 | Sriram et al. |
| 2005/0051796 A1 | 3/2005 | Parikh et al. |
| 2014/0001570 A1* | 1/2014 | Brodsky ............... H01L 29/517 257/E27.06 |
| 2016/0086938 A1 | 3/2016 | Kinzer |
| 2017/0018639 A1 | 1/2017 | Teo et al. |
| 2017/0025406 A1 | 1/2017 | Liao |
| 2017/0330898 A1 | 11/2017 | Cao et al. |
| 2020/0219870 A1 | 7/2020 | Chen et al. |
| 2020/0295171 A1 | 9/2020 | Hung et al. |

FOREIGN PATENT DOCUMENTS

| | | | |
|---|---|---|---|
| CN | 110544630 A | | 12/2019 |
| JP | 2003258130 A | * | 9/2003 |
| JP | 200810467 A | | 1/2008 |

OTHER PUBLICATIONS

First Office Action of the corresponding China patent application No. 202080005364.2 mailed on May 27, 2022.

* cited by examiner

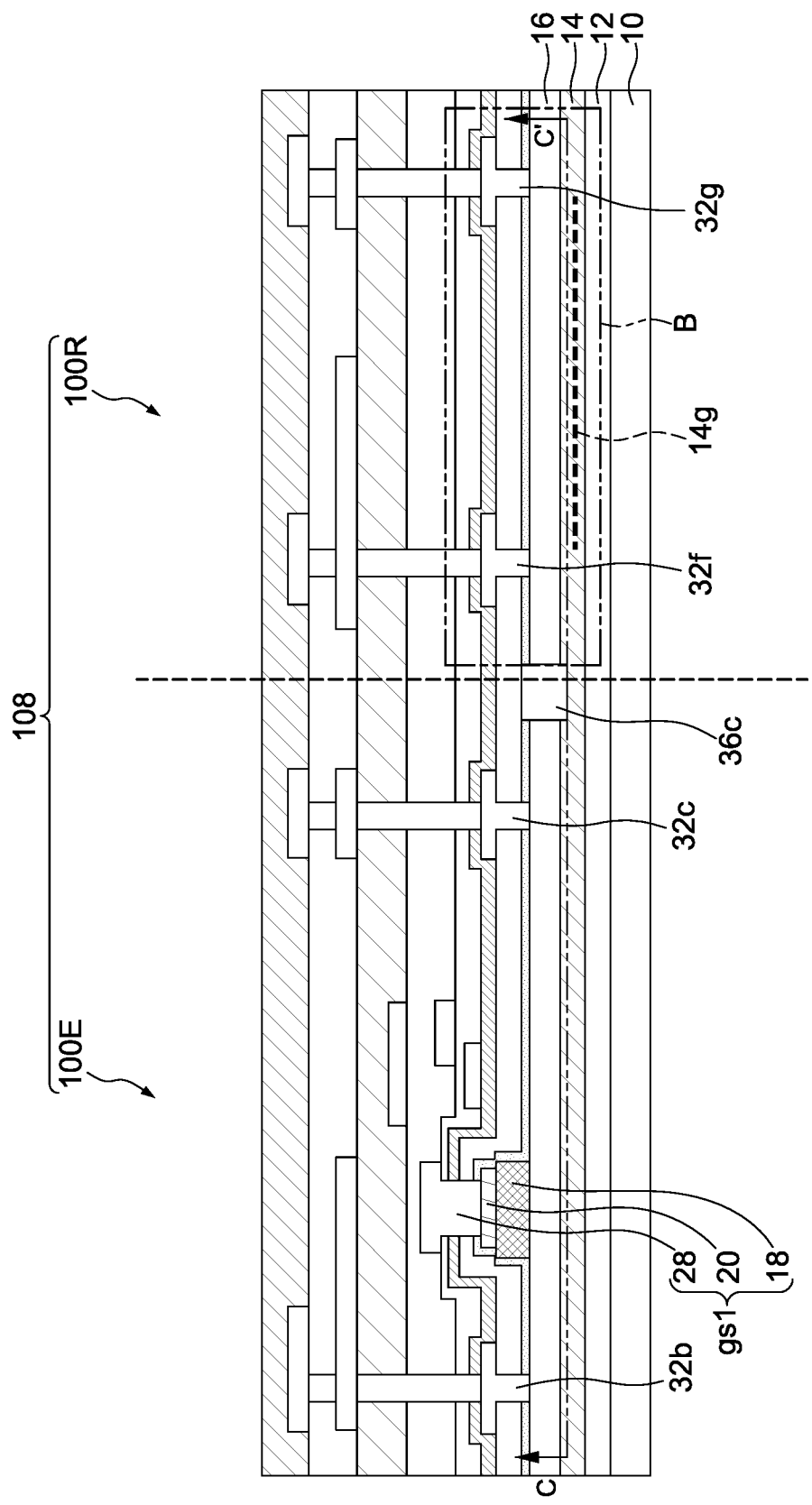

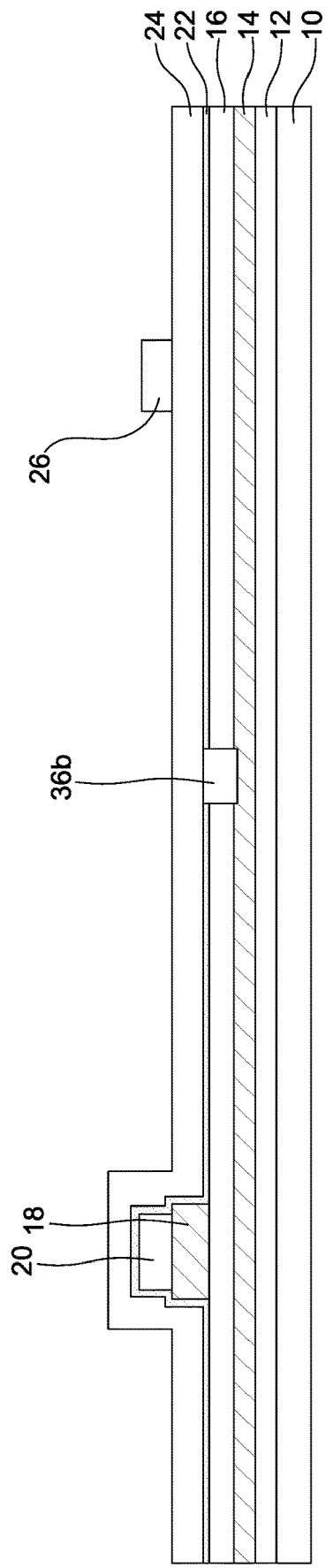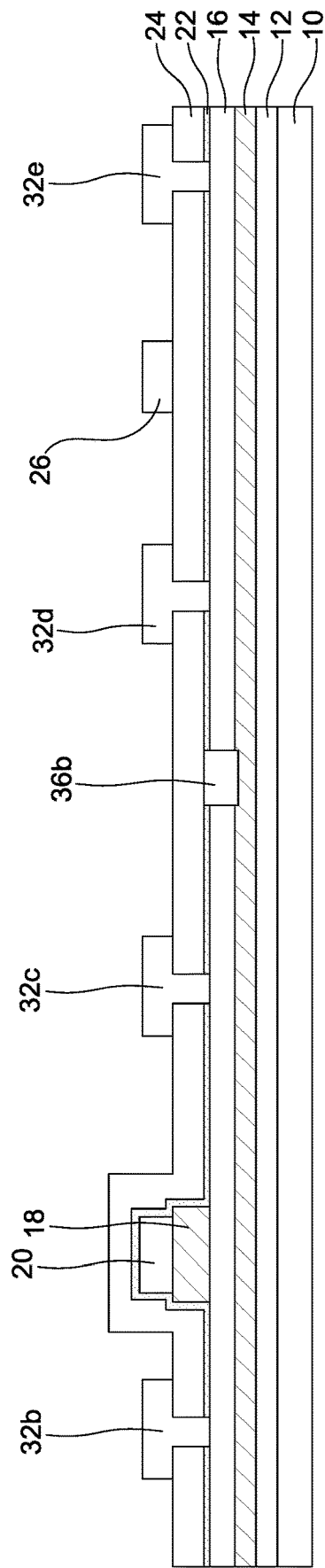
FIG. 9C
FIG. 9D

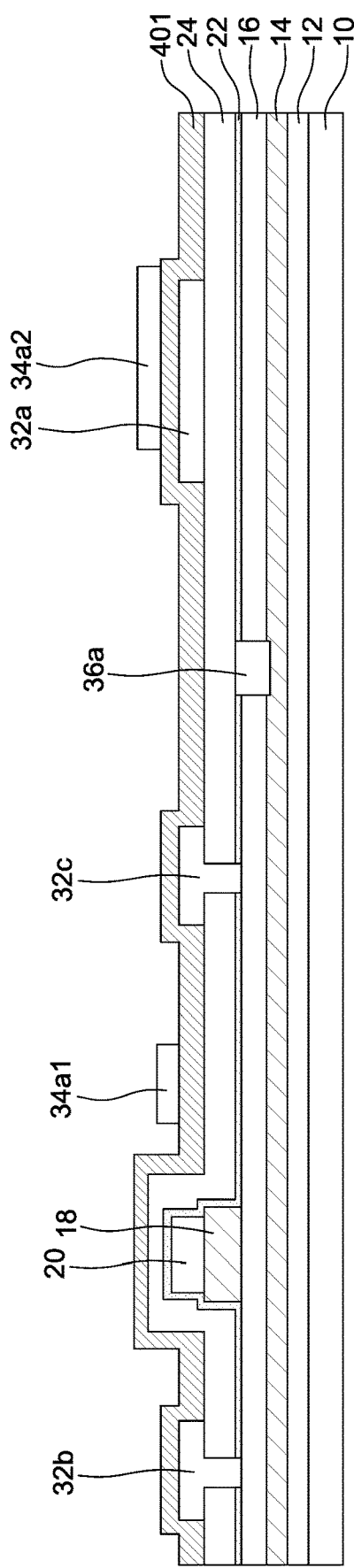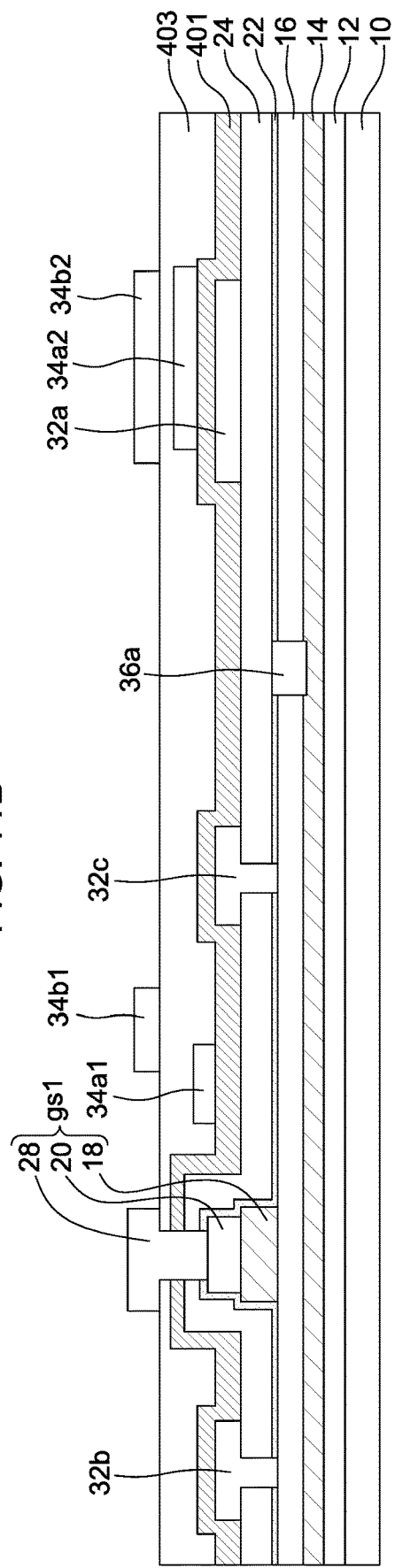

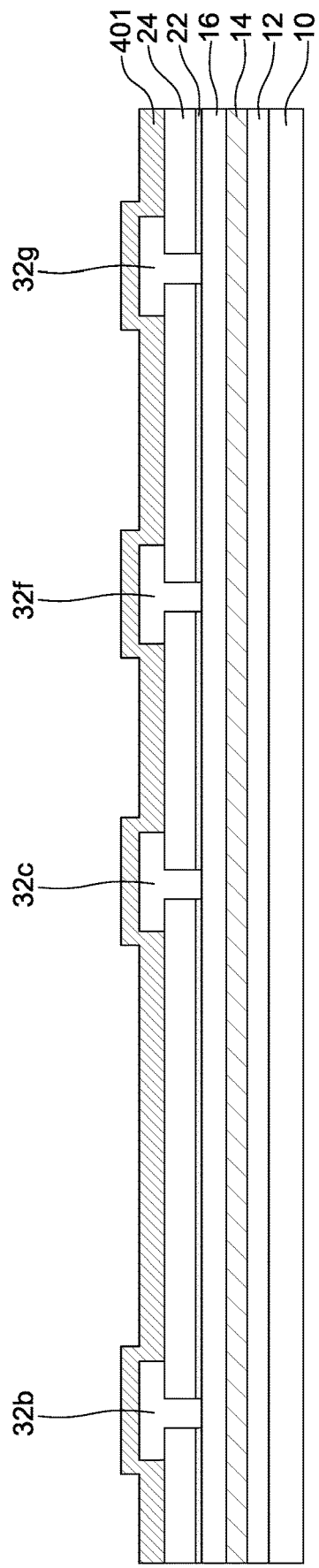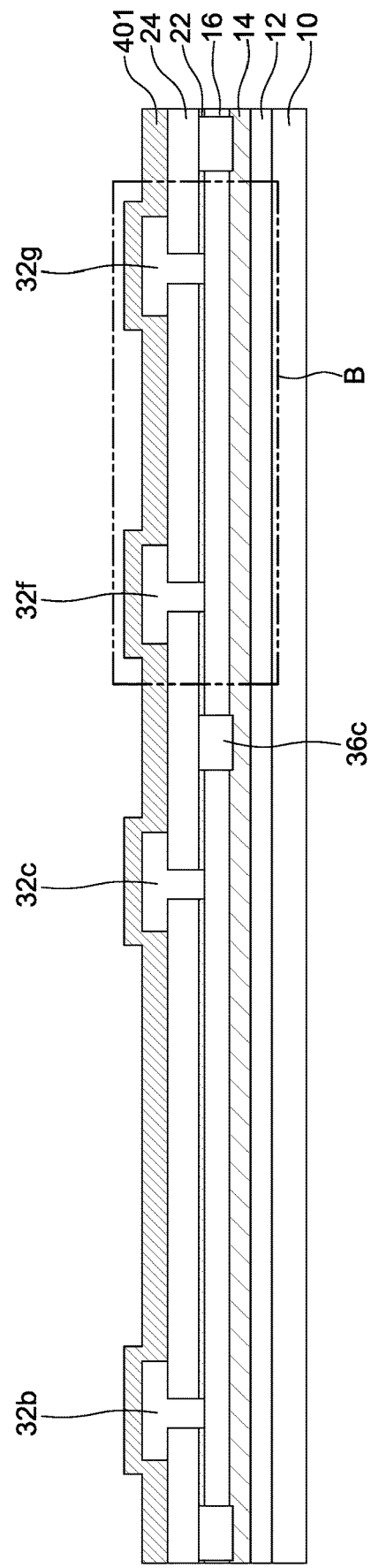
FIG. 12A
FIG. 12B

SEMICONDUCTOR DEVICE AND MANUFACTURING METHOD THEREOF

BACKGROUND

1. Technical Field

The present disclosure relates to the semiconductor field, more particularly to a high electron mobility transistor (HEMT) having high carrier concentration and high carrier mobility, and a fabrication method thereof.

2. Description of the Related Art

A high electron mobility transistor (HEMT) is a field effect transistor. A HEMT is different from a metal-oxide-semiconductor (MOS) transistor in that the HEMT adopts two types of materials having different bandgaps that form a heterojunction, and the polarization of the heterojunction forms a two-dimensional electron gas (2DEG) region in the channel layer for providing a channel for the carriers. HEMTs have garnered a great amount of attention due to their excellent high frequency characteristics. HEMTs can operate at high frequencies because the current gain of HEMTs can be multiple times better than MOS transistors, and thus can be widely used in various mobile devices.

Research is continuously conducted by adopting different materials in the manufacture of HEMTs, for the purpose of achieving HEMTs with enhanced performance. Continual research is also conducted by integrating different types of components in the manufacture of a semiconductor device that includes HEMTs, for the purpose of applying the semiconductor device in different fields.

SUMMARY

According to some embodiments of the present disclosure, a semiconductor device is provided. The semiconductor device includes a substrate, a first nitride semiconductor layer disposed on the substrate, a second nitride semiconductor layer disposed on the first nitride semiconductor layer and having a bandgap greater than that of the first nitride semiconductor layer. The semiconductor device further includes a first gate conductor disposed on a first region of the second nitride semiconductor layer, a passivation layer covering the first gate conductor, and a second gate conductor disposed on the passivation layer and on a second region of the second nitride semiconductor layer, wherein the first region is laterally spaced apart from the second region.

According to some embodiments of the present disclosure, a semiconductor device is provided. The semiconductor device includes a substrate, a first nitride semiconductor layer disposed on the substrate, a second nitride semiconductor layer disposed on the first nitride semiconductor layer and having a bandgap greater than that of the first nitride semiconductor layer. The semiconductor device further includes a first transistor comprising a first gate conductor, a first drain electrode and a first source electrode. The semiconductor device further includes a second transistor comprising a second gate conductor, a second drain electrode and a second source electrode. The semiconductor device further includes a passivation layer, wherein the first gate conductor and the second gate conductor are disposed at opposite sides of the passivation layer.

According to some embodiments of the present disclosure, a method for fabricating a semiconductor device is provided. The method comprises forming a semiconductor structure having a substrate, a channel layer and a barrier layer (16), forming a first gate conductor on a first region of the barrier layer, forming a first dielectric layer covering the first gate conductor, and forming a second gate conductor on the first dielectric layer and on a second region of the barrier layer, which is laterally spaced apart from the first region.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 5A illustrates a cross-sectional view of a semiconductor device including regions of an active component and a passive component, according to some embodiments of the present disclosure;

FIGS. 9A, 9B, 9C, 9D, 9E and 9F illustrate operations for fabricating a semiconductor device according to some embodiments of the present disclosure;

FIGS. 11A, 11B and 11C illustrate operations for fabricating a semiconductor device, according to some embodiments of the present disclosure;

FIGS. 12A and 12B illustrate operations for fabricating a semiconductor device, according to some comparative embodiments of the present disclosure.

DETAILED DESCRIPTION

Figure 1:
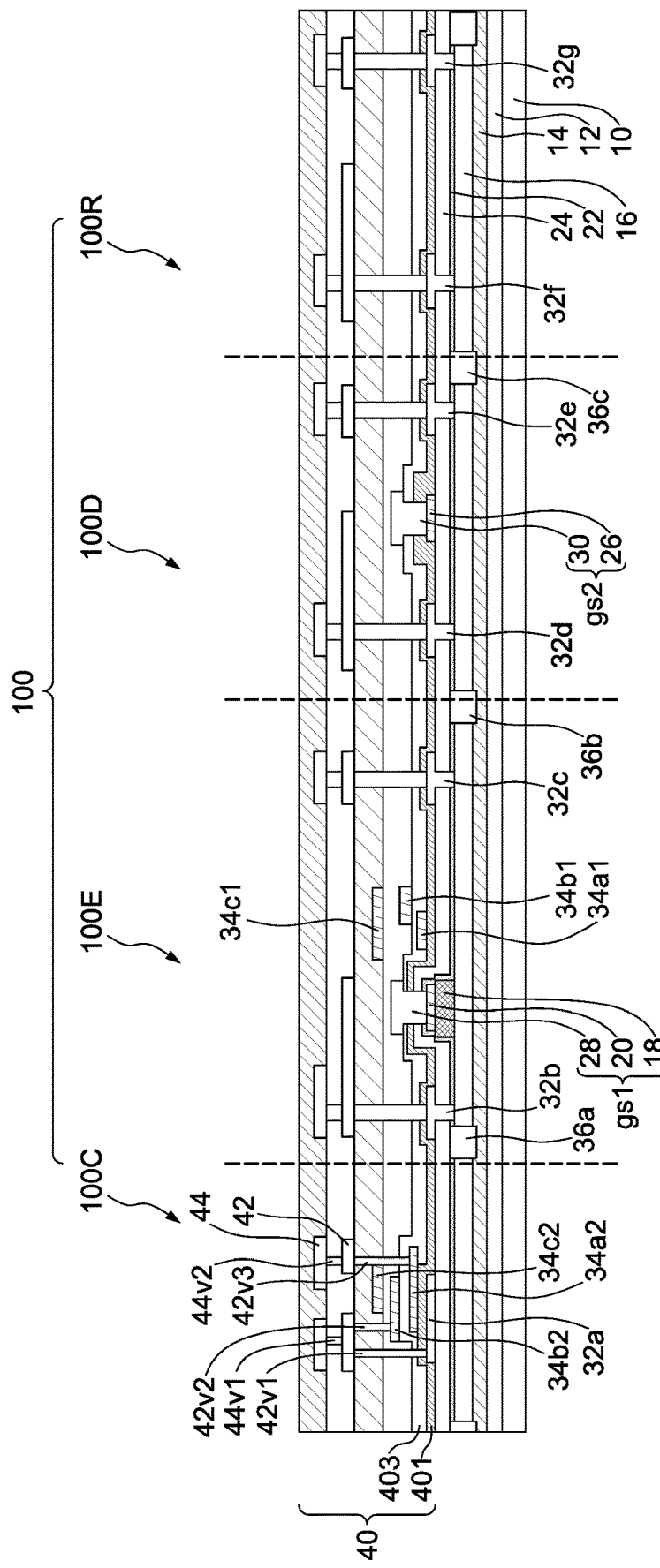
FIG. 1 illustrates a cross-sectional view of a semiconductor device according to some embodiments of the present disclosure.

Embodiments of the present disclosure are discussed in detail below. It should be appreciated, however, that the present disclosure provides many applicable concepts that can be embodied in a wide variety of specific contexts. It should be appreciated that the following disclosure provides for many different embodiments, or examples, for implementing different features of the provided subject matter. Specific examples of components and arrangements are described below. These are, of course, merely examples and are not intended to be limiting.

The following embodiments or examples as illustrated in the drawings are described using a specific language. It should be appreciated, however, that the specific embodiments discussed are merely illustrative and do not limit the scope of the disclosure. In addition, it should be appreciated by persons having ordinary skill in the art that any changes and/or modifications of the disclosed embodiments as well as any further applications of the principles disclosed herein are encompassed within the scope of the present disclosure.

In addition, the present disclosure may repeat reference numerals and/or letters in the various examples. This repetition is for the purpose of simplicity and clarity and does not in itself dictate a relationship between the various embodiments and/or configurations discussed.

Gallium nitride (GaN) is anticipated to be the key material for a next generation power semiconductor device, having the properties of a higher breakdown strength, faster switching speed, higher thermal conductivity, lower on-resistance ($R_{on}$) and higher current gain. Power devices which include this wide-bandgap semiconductor material can significantly outperform the traditional Si-based power chips (for example, MOSFETs). Radio frequency (RF) devices which include this wide-bandgap semiconductor material can significantly outperform the traditional Si-based RF devices. As such, GaN-based power devices/RF devices will play a key role in the market of power conversion products and RF products, which includes battery chargers, smartphones, computers, servers, base stations, automotive electronics, lighting systems and photovoltaics.

FIG. 1 illustrates a cross-sectional view of a semiconductor device according to some embodiments of the present disclosure.

FIG. 1 shows a semiconductor device 100. The semiconductor device 100 may include regions 100C, 100E, 100D and 100R. The regions 100C, 100E, 100D and 100R can be laterally spaced apart from each other. The regions 100C, 100E, 100D and 100R do not overlap with each other. The regions 100C, 100E, 100D and 100R may include electrical components which are different from each other. In some embodiments, the region 100C includes a capacitor. The region 100E includes a transistor. The region 100D includes another transistor. The region 100R includes a resistor.

The semiconductor device 100 may include a substrate 10, a buffer layer 12, a nitride semiconductor layer 14, and a nitride semiconductor layer 16.

The substrate 10 may include, for example, but is not limited to, silicon (Si), doped Si, silicon carbide (SiC), germanium silicide (SiGe), gallium arsenide (GaAs), or other semiconductor materials. The substrate 10 may include, for example, but is not limited to, sapphire, silicon on insulator (SOI), or other suitable materials. In some embodiments, the substrate 10 may include a silicon material. In some embodiments, the substrate 10 may be a silicon substrate.

The buffer layer 12 may include GaN, AlGaN, or aluminum nitride (AlN) and provides an interface from the non-GaN substrate to a GaN based active structure. The buffer layer 14 reduces defect concentration in the active device layers.

The nitride semiconductor layer 14 may include a group III-V layer. The nitride semiconductor layer 14 may include, for example, but is not limited to, group III nitride, e.g., a compound $Al_yGa_{(1-y)}N$, in which $y \le 1$. In some embodiments, the nitride semiconductor layer 14 may include GaN. The nitride semiconductor layer 14 can also be referred to as a channel layer.

The nitride semiconductor layer 16 may include a group III-V layer. The nitride semiconductor layer 16 may include, for example, but not is limited to, group III nitride, e.g., a compound $Al_yGa_{(1-y)}N$, in which $y \le 1$. The nitride semiconductor layer 16 may have a bandgap that is greater than that of the nitride semiconductor layer 14. In some embodiments, a material of the nitride semiconductor layer 16 may include AlGaN. In some embodiments, a material of the nitride semiconductor layer 16 may include undoped AlGaN. The nitride semiconductor layer 16 can also be referred to as a barrier layer.

The nitride semiconductor layer 16 may have a bandgap greater than that of the first nitride semiconductor layer 14. A heterojunction may be formed between the nitride semiconductor layer 14 and the nitride semiconductor layer 16. The polarization of the heterojunction of different nitrides forms a two-dimensional electron gas (2DEG) region in the nitride semiconductor layer 14. The 2DEG region is usually formed in the layer that has a lower bandgap (e.g., GaN).

A passivation layer 22 can be disposed on the nitride semiconductor layer 16. The semiconductor device 100 can include multilayers of dielectric layers above the passivation layer 22. The dielectric layers (for example, the dielectric layers 401 and 403) above the passivation layer 22 can be collectively referred to as an interlayer dielectric (ILD) 40. The dielectric layers 401 and 403 can also be referred to as passivation layers. The ILD 40 also be referred to as a passivation layer.

The regions 100C, 100E, 100D and 100R can be isolated from each other by isolators disposed within the nitride semiconductor layer 16.

The region 100C can be isolated from the region 100E by an isolator 36a. The region 100E can be isolated from the region 100D by an isolator 36b. The region 100D can be isolated from the region 100R by an isolator 36c. The isolators 36a, 36b and 36c can separate the nitride semiconductor layer 16 and the passivation layer 22 of different regions. The isolators 36a, 36b and 36c can disconnect the nitride semiconductor layer 16 and the passivation layer 22 of different regions. The isolators 36a, 36b and 36c can disconnect the 2DEG within the nitride semiconductor layer 14.

Referring to the region 100E of the semiconductor device 100, a semiconductor gate 18 can be disposed on the nitride semiconductor layer 16, and a gate conductor 20 can be disposed on the semiconductor gate 18. The semiconductor gate 18 and the gate conductor 20 can be covered by the passivation layer 22. A gate conductor 28 can be in contact with the gate conductor 20. The semiconductor gate 18, the gate conductor 20, and a portion of the gate conductor 28 can be covered by dielectric layers 24, 401 and 403. The gate conductor 28, the gate conductor 20 and the semiconductor gate 18 can be collectively referred to as a gate stack gs1 or a gate structure gs1. The gate conductor 28 can also be referred to as a conductive terminal 28.

The semiconductor gate 28 may include a group III-V layer. The semiconductor gate 28 may include, for example, but is not limited to, group III nitride. The semiconductor gate 28 may include a compound $Al_yGa_{(1-y)}N$, in which $y \leq 1$. In some embodiments, a material of the semiconductor gate 28 may include a p-type doped group III-V layer. In some embodiments, a material of the semiconductor gate 28 may include p-type doped GaN.

Several conductive layers 34a1, 34b1 and 34c1 can be disposed within the region 100E and laterally spaced apart from the gate stack gs1. The conductive layers 34a1, 34b1 and 34c1 can be vertically spaced apart from each other. The conductive layers 34a1, 34b1 and 34c1 can be referred to as field plates in some applications of the semiconductor device 100.

Conductive terminals 32b and 32c can be disposed on opposite sides of the gate stack gs1. The conductive terminals 32b and 32c can be in contact with the nitride semiconductor layer 16. The conductive terminals 32b and 32c can be surrounded by the dielectric layer 24 and covered by the dielectric layer 401. The dielectric layer 24 can also be a passivation layer.

Referring to the region 100C of the semiconductor device 100, the passivation layer 22 can be disposed on the nitride semiconductor layer 16, and the dielectric layer 24 can be disposed on the passivation layer 22. A conductive layer 32a can be disposed on the dielectric layer 24, and covered/surrounded by a dielectric layer 401. The conductive layer 32a can include materials similar to those of the conductive terminals 32b and 32c. The conductive layer 32a can include materials identical to those of the conductive terminals 32b and 32c. The conductive layer 32a and the conductive terminals 32b and 32c can be formed at the same time during the manufacturing process of the semiconductor device 100.

Several conductive layers can be disposed within the region 100C. For example, conductive layers 34a2, 34b2 and 34c2 can be disposed within the region 100C. The conductive layers 34a2, 34b2 and 34c2 can be vertically spaced apart from each other. The region 100C may include redistribution layers (RDL) 42 and 44 within the ILD 40. Electrical connections can be formed between the conductive layers 32a, 34a2, 34b2 or 34c2. The conductive layers 32a, 34a2, 34b2 or 34c2 can form a capacitor.

In some embodiments, the conductive layer 32a can be electrically connected with the conductive layer 34b2 through the conductive via 42v1, the RDL 42, and the via 42v2. In some embodiments, the conductive layer 34a2 can be electrically connected with the conductive layer 34c2 through the conductive via 42v3.

The conductive layer 32a and the conductive layer 34b2 can be electrically connected to the RDL 44 through the conductive via 44v1. The conductive layer 34a2 and the conductive layer 34c2 can be electrically connected to the RDL 44 through the conductive via 44v2.

Referring to the region 100D of the semiconductor device 100, a gate conductor 26 can be disposed on the dielectric layer 24. A gate conductor 30 can be in contact with the gate conductor 26. The gate conductor 26 and a portion of the gate conductor 30 can be covered by dielectric layers 24, 401 and 403. The gate conductor 30 and the gate conductor 26 can be collectively referred to as a gate stack gs2 or a gate structure gs2. The gate conductor 30 can also be referred to as a conductive terminal 30.

Conductive terminals 32d and 32e can be disposed on opposite sides of the gate stack gs2. The conductive terminals 32d and 32e can be in contact with the nitride semiconductor layer 16. The conductive terminals 32d and 32e can be surrounded by the dielectric layer 24 and covered by the dielectric layer 401.

Referring to the region 100R of the semiconductor device 100, conductive terminals 32f and 32g can be in contact with the nitride semiconductor layer 16. The conductive terminals 32f and 32g can be laterally spaced apart from each other. A 2DEG resistor can be formed between the conductive terminals 32f and 32g. A 2DEG resistor can be electrically connected between the conductive terminals 32f and 32g. The details of the 2DEG resistor within the region 100R will be further illustrated in subsequent paragraphs.

Figure 2A:
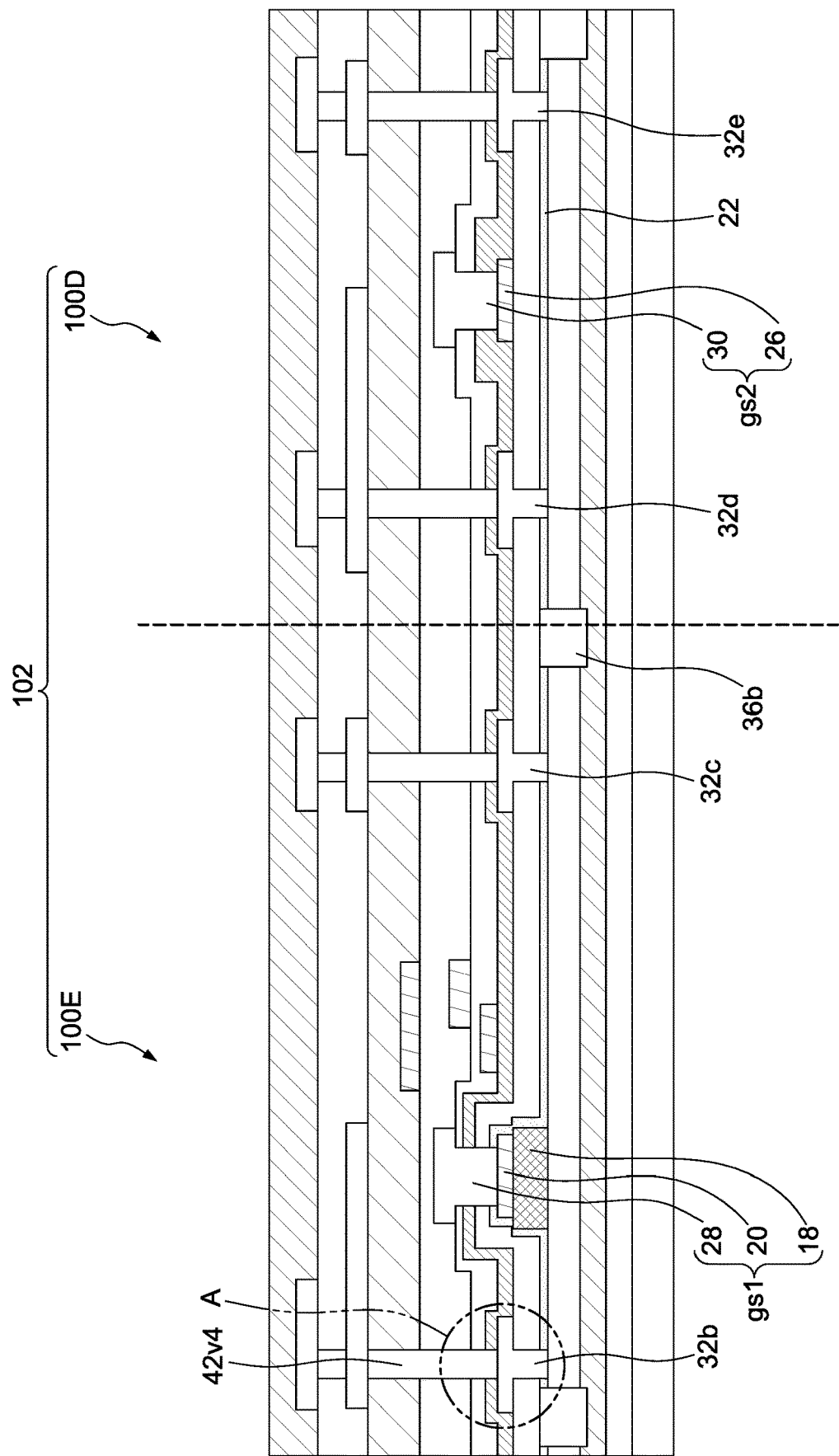
FIG. 2A illustrates a cross-sectional view of a semiconductor device including two regions of active components, according to some embodiments of the present disclosure.

FIG. 2A illustrates a cross-sectional view of a semiconductor device including two regions of active components, according to some embodiments of the present disclosure.

FIG. 2A shows a cross-sectional view of a semiconductor device 102. The semiconductor device includes regions 100E and 100D. The region 100E may include a transistor. The conductive terminals 32b and 32c can be the source/drain of the transistor, and the gate stack gs1 can be the gate of the transistor. The transistor disposed within the region 100E can be an enhancement mode (E-mode) HEMT.

The region 100D may include a transistor. The conductive terminals 32d and 32e can be the source/drain of the transistor, and the gate stack gs2 can be the gate of the transistor. The transistor disposed within the region 100D can be a depletion mode (D-mode) metal-insulator-semiconductor (MIS).

The gate conductor 20 can be disposed under the dielectric layer 24. The gate conductor 26 can be disposed on the dielectric layer 24. The gate conductor 20 and the gate conductor 26 can be disposed on opposite sides of the dielectric layer 24. The gate conductor 20 and the gate conductor 26 can be disposed on opposite sides of the passivation layer 22. The dielectric layer 24 can be disposed between the nitride semiconductor layer 16 and the gate conductor 26. The passivation layer 22 can be disposed between the nitride semiconductor layer 16 and the gate conductor 26.

The region 100E can be isolated from the region 100D by the isolator 36b. However, the E-HEMT of the region 100E can be electrically connected with the D-MIS of the region 100D through RDLs not depicted in FIG. 2A.

The conductive terminals 32b, 32c, 32d and 32e may include the same materials. The conductive terminals 32b, 32c, 32d and 32e may be produced at the same time during the manufacturing process of the semiconductor device 102. The gate conductors 28 and 30 may include the same materials. The gate conductors 28 and 30 may be produced at the same time during the manufacturing process of the semiconductor device 102.

Figure 2B:
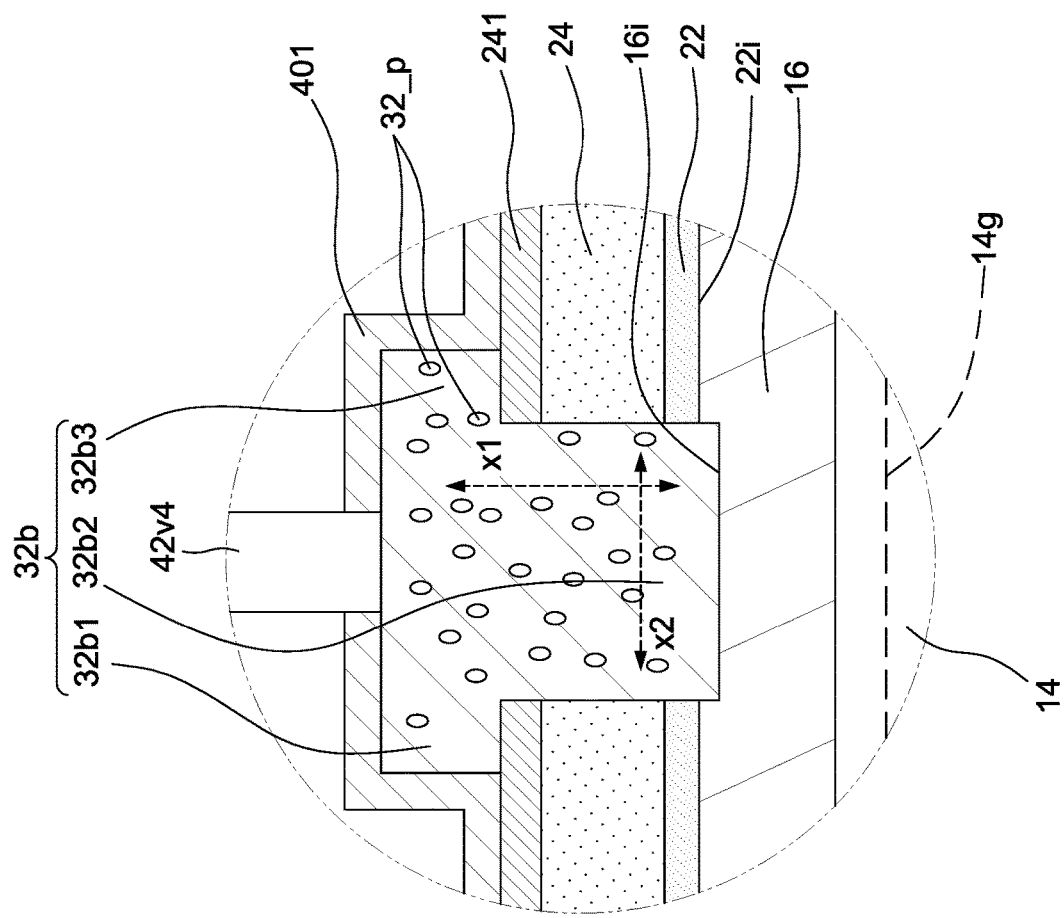
FIG. 2B illustrates an enlarged cross-sectional view of the structure in the dotted-circle A as shown in FIG. 2A, according to some embodiments of the present disclosure.

FIG. 2B illustrates an enlarged cross-sectional view of the structure in the dotted-circle A as shown in FIG. 2A, according to some embodiments of the present disclosure. The structure shown in FIG. 2B can be an enlarged view of the dotted-circle A of the semiconductor device 102 before an annealing process is performed.

An adhesive layer 241 can be disposed on the dielectric layer 24. The adhesive layer 241 may include a nitride layer. The adhesive layer 241 may include a metal nitride layer. The adhesive layer 241 may include, for example, but is not limited to, TiN, AlN and the combination thereof. The adhesive layer 241 may have a uniform thickness. The adhesive layer 241 may have a consistent thickness. The adhesive layer 241 may have a constant thickness. The adhesive layer 241 may include a thickness ranging from approximately 4.5 nm to approximately 15 nm. The adhesive layer 241 may include a thickness ranging from approximately 4.5 nm to approximately 9 nm. The adhesive layer 241 may include a thickness of about 5 nm.

The conductive terminal 32b may include semiconductor material 32_p. The semiconductor material 32_p can be evenly distributed within the conductive terminal 32b. The semiconductor material 32_p can be evenly mixed with the conductive materials or alloys of the conductive terminal 32b. The semiconductor material 32_p and the conductive materials of the conductive terminal 32b can form compounds. In some embodiments, the semiconductor material 32_p may include one or more of, for example, carbon (C), silicon (Si), germanium (Ge), Tin (Sn), sulfur (S), Selenium (Se), or tellurium (Te).

The semiconductor material 32_p can be evenly distributed within the portions 32b1, 32b2 and 32b3. A concentration of the semiconductor material 32_p can be evenly distributed within the conductive terminal 32b along a vertical axis x1. A concentration of the semiconductor material 32_p can be evenly distributed within the conductive terminal 32b along a horizontal axis x2.

A concentration of the semiconductor material 32_p in the conductive terminal 32b may range from approximately 0.1% to approximately 0.3%. A concentration of the semiconductor material 32_p in the conductive terminal 32b may range from approximately 0.3% to approximately 0.5%. A concentration of the semiconductor material 32_p in the conductive terminal 32b may range from approximately 0.5% to approximately 0.8%. A concentration of the semiconductor material 32_p in the conductive terminal 32b may range from approximately 0.2% to approximately 0.6%. A concentration of the semiconductor material 32_p in the conductive terminal 32b may range from approximately 0.2% to approximately 0.8%.

The portion 32b2 of the conductive terminal 32b may extend into the nitride semiconductor layer 16. An interface 16i may exist between the portion 32b2 of the conductive terminal 32b and the nitride semiconductor layer 16. An interface 22i may exist between the passivation layer 22 and the nitride semiconductor layer 16. The interface 16i can also be the bottom surface of the conductive terminal 32b.

The interface 16i may not be coplanar with the interface 22i. The interface 16i may be misaligned with the interface 22i. The interface 16i may be lower than the interface 22i. Referring to FIG. 2B, 2DEG 14g can be formed within the nitride semiconductor layer 14. The interface 16i (i.e., the bottom surface of the conductive terminal 32b) being closer to the 2DEG 14g can improve the electrical connection of the conductive terminal 32b.

Figure 2C:
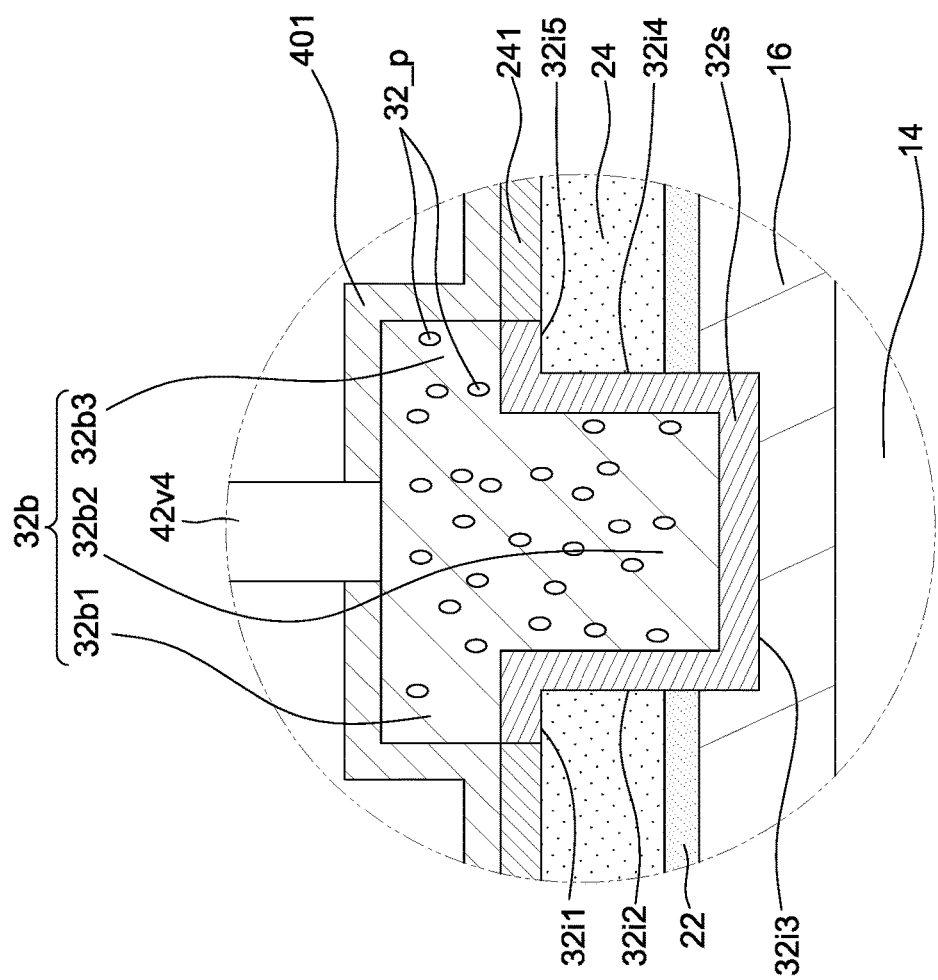
FIG. 2C illustrates an enlarged cross-sectional view of the structure in the dotted-circle A as shown in FIG. 2A, according to some embodiments of the present disclosure.
Figure 2D:
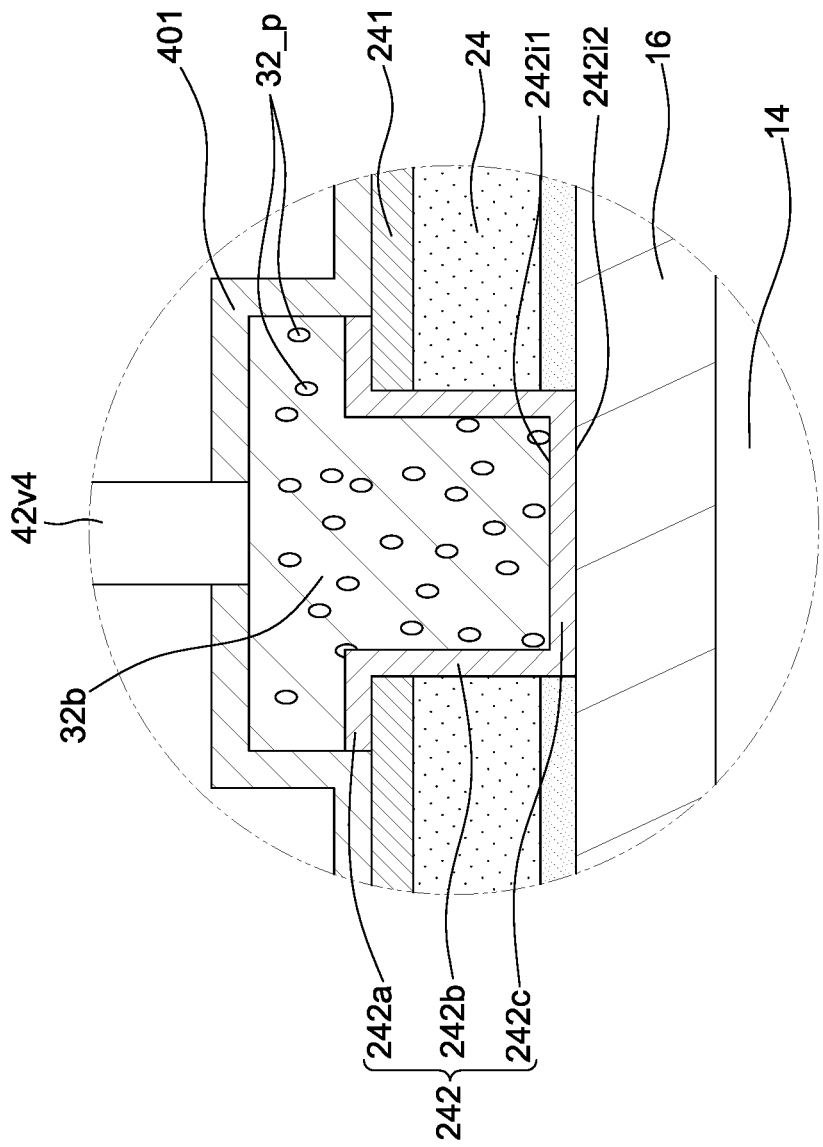
FIG. 2D illustrates an enlarged cross-sectional view of the structure in the dotted-circle A as shown in FIG. 2A, according to some embodiments of the present disclosure.

FIG. 2C illustrates an enlarged cross-sectional view of the structure in the dotted-circle A as shown in FIG. 2A, according to some embodiments of the present disclosure. The structure shown in FIG. 2C can be an enlarged view of the dotted-circle A of the semiconductor device 102 after an annealing process is performed.

The semiconductor material 32_p and the conductive materials within the conductive terminal 32b may form a salicide (self-aligned silicide) layer 32s during the annealing process. The salicide layer 32s can be conformally formed along the interfaces 32i1, 32i2, 32i4 and 32i5 between the conductive terminal 32b and the dielectric layer 24. The salicide layer 32s can be conformally formed along the interface 32i3 between the conductive terminal 32b and the nitride semiconductor layer 16. In some embodiments, the salicide layer 32s can be deemed as a portion of the conductive terminal 32b.

The salicide layer 32s may facilitate reducing the resistance of the ohmic contact formed between the conductive terminal 32b and the nitride semiconductor layer 16. In some embodiments, the salicide layer 32s may facilitate reducing the resistance of the ohmic contact down to a level of 0.3 Ωmm. By incorporating semiconductor material 32_p into the conductive terminal 32b, the salicide layer 32s can be formed, without disposing an additional silicon layer before the conductive terminal 32b is formed. By incorporating semiconductor material 32_p into the conductive terminal 32b, the step of disposing an additional silicon layer before the conductive terminal 32b is formed can be eliminated. The elimination of the additional silicon layer may facilitate reducing the overall cost of manufacturing.

The salicide layer 32s includes the semiconductor material 32_p. The concentration of the semiconductor material 32_p within the salicide layer 32s can be greater than that within the conductive terminal 32b.

A concentration of the semiconductor material 32_p in the salicide layer 32s may be greater than 0.8%. A concentration of the semiconductor material 32_p in the salicide layer 32s may be greater than 1.2%. A concentration of the semiconductor material 32_p in the salicide layer 32s may be greater than 1.8%. A concentration of the semiconductor material 32_p in the salicide layer 32s may be greater than 2.5%.

A concentration of the semiconductor material 32_p in the salicide layer 32s may be smaller than 6%. A concentration of the semiconductor material 32_p in the salicide layer 32s may be smaller than 5%. A concentration of the semiconductor material 32_p in the salicide layer 32s may be smaller than 4%. A concentration of the semiconductor material 32_p in the salicide layer 32s may be smaller than 3%.

A concentration of the semiconductor material 32_p in the salicide layer 32s may range from approximately 0.2% to approximately 3%. A concentration of the semiconductor material 32_p in the salicide layer 32s may range from approximately 0.4% to approximately 3%. A concentration of the semiconductor material 32_p in the salicide layer 32s may range from approximately 0.6% to approximately 4%. A concentration of the semiconductor material 32_p in the salicide layer 32s may range from approximately 0.8% to approximately 5%. A concentration of the semiconductor material 32_p in the salicide layer 32s may range from approximately 1% to approximately 6%.

FIG. 2D illustrates an enlarged cross-sectional view of the structure in the dotted-circle A as shown in FIG. 2A, according to some embodiments of the present disclosure.

The structure shown in FIG. 2D can be an enlarged view of the dotted-circle A of the semiconductor device 102 before an annealing process is performed.

An intermediate layer 242 may be disposed near the bottom of the conductive terminal 32b. The intermediate layer 242 may be disposed between the conductive terminal 32b and the passivation layer 16. The intermediate layer 242 may be disposed between the conductive terminal 32b and the dielectric layer 24. The intermediate layer 242 may be disposed between the conductive terminal 32b and the adhesive layer 241. The intermediate layer 242 can be deemed as a portion of the conductive terminal 32b.

The intermediate layer 242 may have a uniform thickness. The intermediate layer 242 may have a consistent thickness. The intermediate layer 242 may have a constant thickness. The intermediate layer 242 may include a thickness ranging from approximately 4.5 nm to approximately 15 nm. The intermediate layer 242 may include a thickness ranging from approximately 4.5 nm to approximately 9 nm. The intermediate layer 242 may include a thickness of about 5 nm.

The intermediate layer 242 may not affect the transmission of the carriers. The intermediate layer 242 may not degrade the transmission of the carriers. The intermediate layer 242 may not affect the transmission of the electrons. The intermediate layer 242 may not affect the transmission of the electrons between the nitride semiconductor layer 16 and the conductive terminal 32b. The intermediate layer 242 may not affect the transmission of the electrons between the nitride semiconductor layer 16 and the conductive terminal 32b.

The intermediate layer 242 may form an ohmic contact with the nitride semiconductor layer 16. The intermediate layer 242 may form a low-resistance ohmic contact. The intermediate layer 242 may reduce the resistance of an ohmic contact to about 0.3 Ω·mm.

The intermediate layer 242 and the conductive terminal 32b may form an ohmic contact with the nitride semiconductor layer 16. The intermediate layer 242 may stop diffusion of the element of the conductive terminal 32b. The intermediate layer 242 may block diffusion of the element of the conductive terminal 32b. The intermediate layer 242 may alleviate diffusion of the element of the conductive terminal 32b. The intermediate layer 242 may prevent the element of the conductive terminal 32b from entering the nitride semiconductor layer 16. The intermediate layer 242 may make the nitride semiconductor layer 16 devoid of the element of the conductive terminal 32b. The intermediate layer 242 may make the nitride semiconductor layer 16 devoid of at least one of titanium, aluminum, and silicon of the conductive terminal 32b.

The intermediate layer 242 may include a nitride layer. The intermediate layer 242 may include a metal nitride layer. The intermediate layer 242 may include, for example, but is not limited to, TiN, AlN and the combination thereof. In some embodiments, the intermediate layer 242 may include materials similar to or identical to those of the adhesive layer 241.

Referring to FIG. 2D, the intermediate layer 242 includes portions 242a, 242b and 242c. The portion 242a can be disposed on the adhesive layer 241. The portion 242b can be disposed between the conductive terminal 32b and the dielectric layer 24. The portion 242c can be disposed between the conductive terminal 32b and the nitride semiconductor layer 16.

An interface 242i1 may be formed between the conductive terminal 32b and the intermediate layer 242. An interface 242i2 may be formed between the intermediate layer 242 and the nitride semiconductor layer 16.

The interface 242i2 may be substantially even. The interface 242i2 may be substantially flat. The interface 242i2 may be substantially smooth. The interface 242i2 may be substantially clear. The interface 242i2 may be substantially continuous.

The distance between the interface 242i1 and the interface 242i2 may range from approximately 4.5 nm to approximately 15 nm. The distance between the interface 242i1 and the interface 242i2 may range from approximately 4.5 nm to approximately 9 nm. The distance between the interface 242i1 and the interface 242i2 may be about 5 nm.

It should be noted that, the intermediate layer 242 may be applied due to the mechanism of the tunneling effect. It should be noted that, the intermediate layer 242 may be inserted between the nitride semiconductor layer 16 and the conductive terminal 32b due to the mechanism of the tunneling effect.

The distance between the interface 242i1 and the interface 242i2 can be close enough to let carriers pass through. The distance between the interface 242i1 and the interface 242i2 can be close enough to let electrons pass through. The distance between the interface 242i1 and the interface 242i2 can be close enough to let holes pass through.

Due to the application of the intermediate layer 242, the nitride semiconductor layer 16 may be devoid of the element of the conductive terminal 32b. Due to the application of the intermediate layer 242, the element of the conductive terminal 32b may not diffuse into the nitride semiconductor layer 16. Due to the application of the intermediate layer 242, the element (such as Ti) of the conductive terminal 32b may not diffuse into the nitride semiconductor layer 16. Due to the application of the intermediate layer 242, the element (such as Si) of the conductive terminal 32b may not diffuse into the nitride semiconductor layer 16. Due to the application of the intermediate layer 242, the resistance of the ohmic contact may be reduced. Due to the application of the intermediate layer 242, the resistance of the ohmic contact between the nitride semiconductor layer 16 and the conductive terminal 32b may be reduced.

Figure 2E:
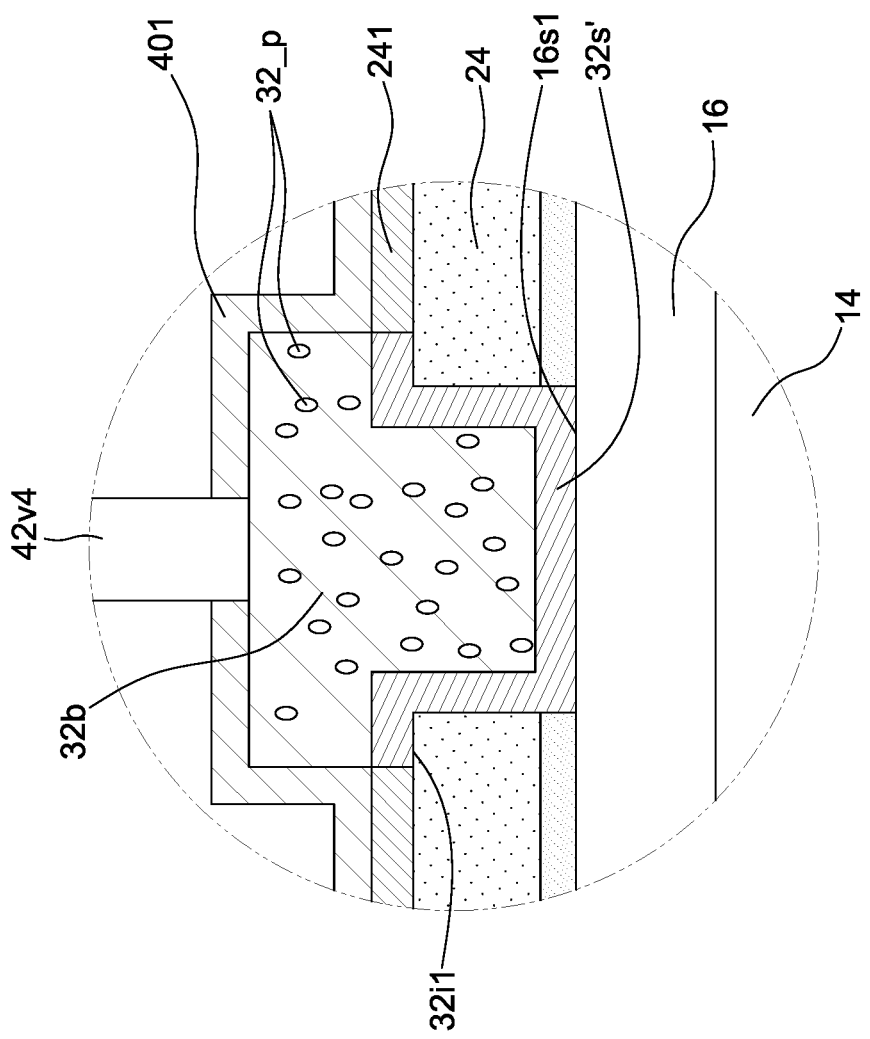
FIG. 2E illustrates an enlarged cross-sectional view of the structure in the dotted-circle A as shown in FIG. 2A, according to some embodiments of the present disclosure.

FIG. 2E illustrates an enlarged cross-sectional view of the structure in the dotted-circle A as shown in FIG. 2A, according to some embodiments of the present disclosure. The structure shown in FIG. 2E can be an enlarged view of the dotted-circle A of the semiconductor device 102 after an annealing process is performed.

The conductive materials of the conductive terminal 32b, the semiconductor material 32_p within the conductive terminal 32b, a portion of the adhesive layer 241 (i.e., the portion of the adhesive layer 241 that is under the portion 242a of the intermediate layer 242), and the intermediate layer 242 may form a salicide (self-aligned silicide) layer 32s' during the annealing process. In some embodiments, the salicide layer 32s' can be deemed as a portion of the conductive terminal 32b.

The salicide layer 32s' includes the semiconductor material 32_p. The concentration of the semiconductor material 32_p within the salicide layer 32s' can be greater than that within the conductive terminal 32b.

A concentration of the semiconductor material 32_p in the salicide layer 32s' may be greater than 0.8%. A concentration of the semiconductor material 32_p in the salicide layer 32s' may be greater than 1.2%. A concentration of the semiconductor material 32_p in the salicide layer 32s' may be greater than 1.8%. A concentration of the semiconductor material 32_p in the salicide layer 32s' may be greater than 2.5%.

A concentration of the semiconductor material 32_p in the salicide layer 32s' may be smaller than 6%. A concentration of the semiconductor material 32_p in the salicide layer 32s' may be smaller than 5%. A concentration of the semiconductor material 32_p in the salicide layer 32s' may be smaller than 4%. A concentration of the semiconductor material 32_p in the salicide layer 32s' may be smaller than 3%.

A concentration of the semiconductor material 32_p in the salicide layer 32s' may range from approximately 0.2% to approximately 3%. A concentration of the semiconductor material 32_p in the salicide layer 32s' may range from approximately 0.4% to approximately 3%. A concentration of the semiconductor material 32_p in the salicide layer 32s' may range from approximately 0.6% to approximately 4%. A concentration of the semiconductor material 32_p in the salicide layer 32s' may range from approximately 0.8% to approximately 5%. A concentration of the semiconductor material 32_p in the salicide layer 32s' may range from approximately 1% to approximately 6%.

Figure 3:
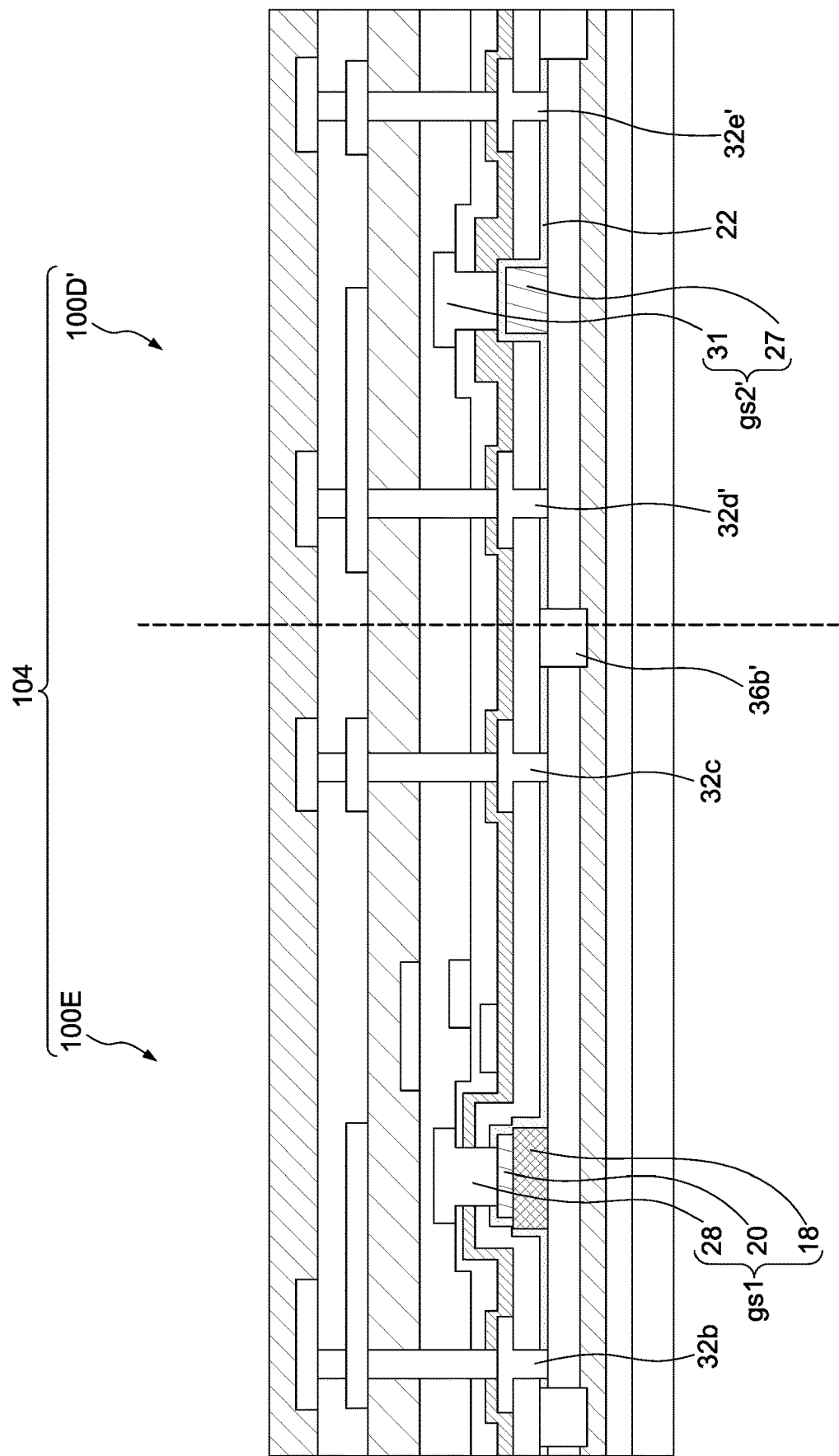
FIG. 3 illustrates a cross-sectional view of a semiconductor device including two regions of active components, according to some embodiments of the present disclosure.

FIG. 3 illustrates a cross-sectional view of a semiconductor device including two regions of active components, according to some embodiments of the present disclosure.

FIG. 3 shows a cross-sectional view of a semiconductor device 104. The semiconductor device 104 includes regions 100E and 100D'. The region 100E may include a transistor. The conductive terminals 32b and 32c can be the source/drain of the transistor, and the gate stack gs1 can be the gate of the transistor. The transistor disposed within the region 100E can be an enhancement mode (E-mode) HEMT.

The region 100D' may include a transistor. The conductive terminals 32d' and 32e' can be the source/drain of the transistor, and the gate stack gs2' (including gate conductors 27 and 31) can be the gate of the transistor. The gate conductor 27 can be in direct contact with the nitride semiconductor layer 16. The gate conductor 27 can be covered by the passivation layer 22. The gate conductors 27 and 31 can be disposed on opposite sides of the passivation layer 22. The transistor disposed within the region 100D' can be a depletion mode (D-mode) HEMT.

The region 100E can be isolated from the region 100D' by the isolator 36b'. However, the E-HEMT of the region 100E can be electrically connected with the D-HEMT of the region 100D' through RDLs not depicted in FIG. 3.

The conductive terminals 32b, 32c, 32d' and 32e' may include the same materials. The conductive terminals 32b, 32c, 32d' and 32e' may be produced at the same time during the manufacturing process of the semiconductor device 104. The gate conductors 28 and 31 may include the same materials. The gate conductors 28 and 31 may be produced at the same time during the manufacturing process of the semiconductor device 104.

Figure 4:
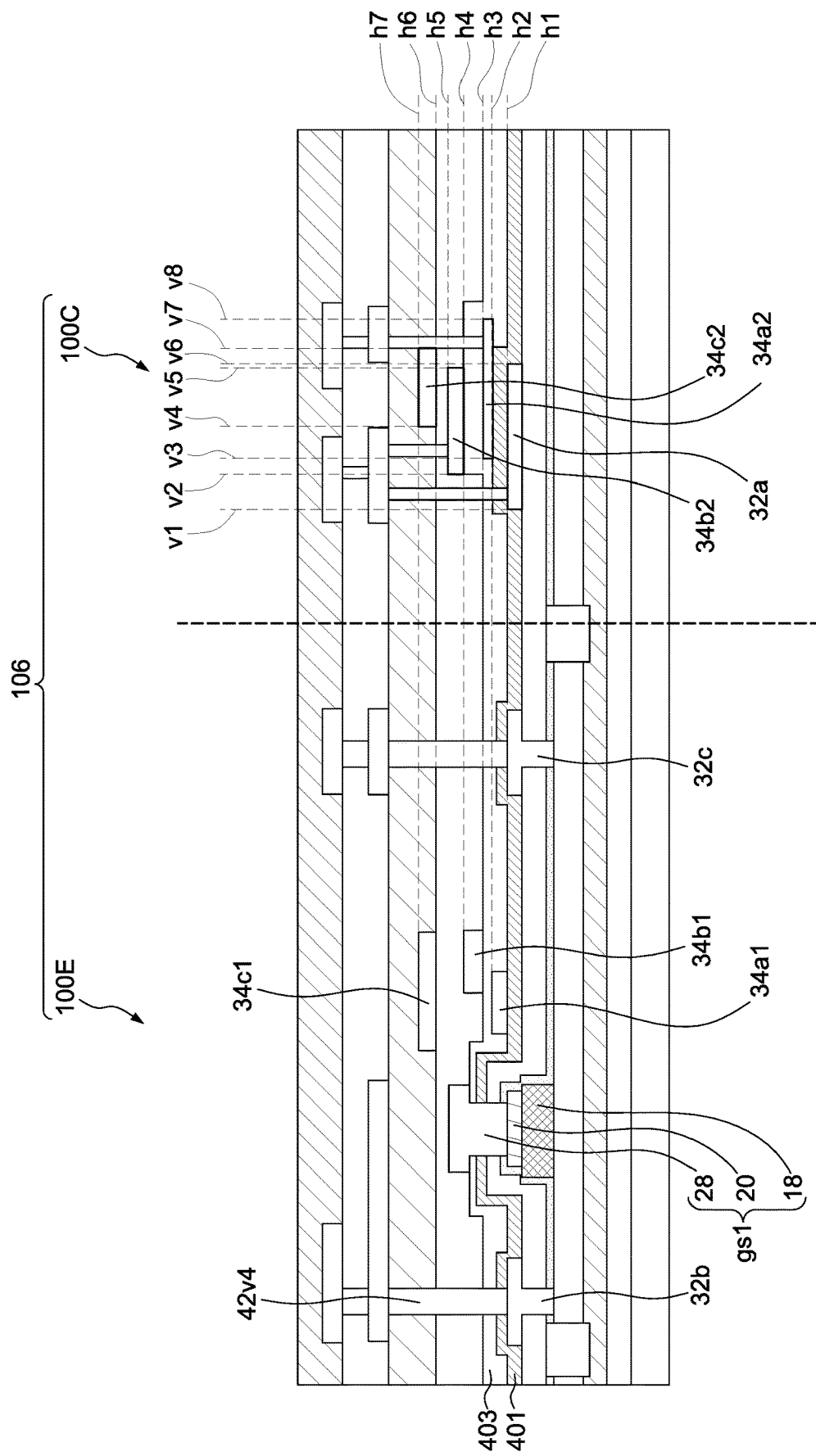
FIG. 4 illustrates a cross-sectional view of a semiconductor device including regions of an active component and a passive component, according to some embodiments of the present disclosure.

FIG. 4 illustrates a cross-sectional view of a semiconductor device including regions of an active component and a passive component, according to some embodiments of the present disclosure.

FIG. 4 shows a cross-sectional view of a semiconductor device 106. The semiconductor device 106 includes regions 100E and 100C. The region 100E may include a transistor. The conductive terminals 32b and 32c can be the source/drain of the transistor, and the gate stack gs1 can be the gate of the transistor. The transistor disposed within the region 100E can be an enhancement mode (E-mode) HEMT.

Several conductive layers 34a1, 34b1 and 34c1 can be disposed within the region 100E and laterally spaced apart from the gate stack gs1. The conductive layers 34a1, 34b1 and 34c1 can be vertically spaced apart from each other. The conductive layers 34a1, 34b1 and 34c1 can be referred to as field plates in some applications of the semiconductor device 106.

The region 100C may include a capacitor. The capacitor within the region 100C can be constituted by two or more of the conductive layers 32a, 34a2, 34b2 and 34c2.

The conductive layer 32a can include materials similar to those of the conductive terminals 32b and 32c. The conductive layer 32a can include materials identical to those of the conductive terminals 32b and 32c. The conductive layer 32a and the conductive terminals 32b and 32c can be formed at the same time during the manufacturing process of the semiconductor device 106.

The conductive layer 34a1 of the region 100E can include materials similar to those of the conductive layer 34a2 of the region 100C. The conductive layer 34a1 of the region 100E can include materials identical to those of the conductive layer 34a2 of the region 100C. The conductive layer 34a1 of the region 100E and the conductive layer 34a2 of the region 100C can be formed at the same time during the manufacturing process of the semiconductor device 106.

The conductive layer 34b1 of the region 100E can include materials similar to those of the conductive layer 34b2 of the region 100C. The conductive layer 34b1 of the region 100E can include materials identical to those of the conductive layer 34b2 of the region 100C. The conductive layer 34b1 of the region 100E and the conductive layer 34b2 of the region 100C can be formed at the same time during the manufacturing process of the semiconductor device 106.

The conductive layer 34c1 of the region 100E can include materials similar to those of the conductive layer 34c2 of the region 100C. The conductive layer 34c1 of the region 100E can include materials identical to those of the conductive layer 34c2 of the region 100C. The conductive layer 34c1 of the region 100E and the conductive layer 34c2 of the region 100C can be formed at the same time during the manufacturing process of the semiconductor device 106.

In some embodiments, the conductive layers 34a1, 34b1 and 34c1 of the region 100E can include materials different from each other. In some embodiments, the conductive layers 32a, 34a2, 34b2 and 34c2 of the region 100C can include materials different from each other.

In some embodiments, the conductive terminals 32b and 32c may include materials similar with those of the gate conductor 20. In some embodiments, the conductive terminals 32b and 32c may include materials identical to those of the gate conductor 20.

The gate conductor 20 may include titanium nitride (TiN). The thickness of the gate conductor 20 can be, for example, about 200 nm. The gate conductor 20 can include other conductive materials. In some embodiments, the gate conductor 20 can include polycrystal silicon doped with an impurity such as boron (B) or phosphorus (P). In some embodiments, the gate conductor 20 can include Ti, Al, Ni, or Au. Further, the gate conductor 20 can include a metal compound comprising, for example, Ti, Al, Ni, and Au and Si (metal silicide). Further, the gate conductor 20 can include a metal nitride comprising, for example, Ti, Al, Ni, and Au.

The gate conductor 20 can include a multi-layered structure. In some embodiments, the gate conductor 20 can include a stacked structure of a plurality of kinds of conductive films. The material and the thickness of the gate conductor 20 can be selected optionally in accordance with the application of the semiconductor device.

In some embodiments, the conductive terminals 32b and 32c may include a stacked film comprising a TiN film and an Al film thereover. The thickness of the TiN film is, for example, about 50 nm and the thickness of the Al film is, e.g., about 1000 nm. As with the material for the conductive terminals 32b and 32c, any material that can be in ohmic contact with the nitride semiconductor layer 16 may be used. As with the material forming the conductive terminals 32b and 32c, metal films comprising, for example, Ti, Al, Mo (molybdenum), Nb (niobium), V (vanadium), etc., may also be used. Further, mixtures (alloys) of such metals, or a film of compounds of such metals and Si (metal silicide film), or nitride of such metals can be used. Further, a stacked film of such materials may also be used.

Although the conductive layer 34a1 of the region 100E and the conductive layer 34a2 of the region 100C can be formed at the same time, the lower surface of the conductive layer 34a1 (see dashed-line h1) can be misaligned with the lower surface of the conductive layer 34a2 (see dashed-line h2). In addition, the upper surface of the conductive layer 34a1 (see dashed-line h2) can be misaligned with the upper surface of the conductive layer 34a2 (see dashed-line h3). The lower surface of the conductive layer 34a1 (see dashed-line h1) and the lower surface of the conductive layer 34a2 (see dashed-line h2) can be non-coplanar. The upper surface of the conductive layer 34a1 (see dashed-line h2) and the upper surface of the conductive layer 34a2 (see dashed-line h3) can be non-coplanar.

Although the conductive layer 34b1 of the region 100E and the conductive layer 34b2 of the region 100C can be formed at the same time, the lower surface of the conductive layer 34b1 (see dashed-line h3) can be misaligned with the lower surface of the conductive layer 34b2 (see dashed-line h4). In addition, the upper surface of the conductive layer 34b1 (see dashed-line h4) can be misaligned with the upper surface of the conductive layer 34b2 (see dashed-line h5). The lower surface of the conductive layer 34b1 (see dashed-line h3) and the lower surface of the conductive layer 34b2 (see dashed-line h4) can be non-coplanar. The upper surface of the conductive layer 34b1 (see dashed-line h4) and the upper surface of the conductive layer 34b2 (see dashed-line h5) can be non-coplanar.

The conductive layer 34c1 of the region 100E and the conductive layer 34c2 of the region 100C can be formed at the same time, and the lower surface of the conductive layer 34c1 can be aligned/coplanar with the lower surface of the conductive layer 34c2 (see dashed-line h6). In addition, the upper surface of the conductive layer 34c1 can be aligned/coplanar with the upper surface of the conductive layer 34c2 (see dashed-line h7).

Referring again to FIG. 4, the conductive layers 32a, 34a2, 34b2 and 34c2 can be vertically spaced apart from each other. The edges of the conductive layers 32a, 34a2, 34b2 and 34c2 can be laterally spaced apart from each other. In some embodiments, the left edges v1, v2, v3 and v4 of the conductive layers 32a, 34a2, 34b2 and 34c2 can be misaligned with each other. In some embodiments, the right edges v5, v6, v7 and v8 of the conductive layers 32a, 34a2, 34b2 and 34c2 can be misaligned with each other.

The dielectric layer 401 can cover the gate conductor 20, the conductive terminals 32b and 32c, and the conductive layer 32a. Referring to region 100E, the conductive layer 34a1 and the conductive terminal 32c can be disposed on opposite sides of the dielectric layer 401. Referring to region 100C, the conductive layers 32a and 34a2 can be disposed on opposite sides of the dielectric layer 401.

The dielectric layer 403 can cover the conductive layers 34a1 and 34a2. Referring to region 100E, the conductive layers 34a1 and 34b1 can be disposed on opposite sides of the dielectric layer 403. Referring to region 100C, the conductive layers 34a2 and 34b2 can be disposed on opposite sides of the dielectric layer 403.

FIG. 5A illustrates a cross-sectional view of a semiconductor device including regions of an active component and a passive component, according to some embodiments of the present disclosure.

FIG. 5A shows a cross-sectional view of a semiconductor device 108. The semiconductor device 108 includes regions 100E and 100R. The region 100E may include a transistor. The conductive terminals 32b and 32c can be the source/drain of the transistor, and the gate stack gs1 can be the gate of the transistor. The transistor disposed within the region 100E can be an enhancement mode (E-mode) HEMT.

The region 100R may include a resistor. The resistor of the region 100R can be located within the dotted-rectangle B as shown in FIG. 5A. The resistor of the region 100R can be electrically connected between the conductive terminals 32f and 32g. The resistor of the region 100R can be formed by doping impurities into the nitride semiconductor layer 14. The resistor of the region 100R can be formed by ion implantation. The resistor of the region 100R can be formed in the nitride semiconductor layer 14 by damaging the crystal lattice structure with ion implantation (e.g., implanting nitrogen (N), argon (Ar), boron (B), or phosphorus (P)).

The resistance of the resistor within the dotted-rectangle B can be controlled during the doping process. In some embodiments, the resistance of the resistor within the dotted-rectangle B can be controlled by modifying the types or the amounts of the impurities used during the doping process. The resistance of the resistor within the dotted-rectangle B can have a relatively high value with the precondition that the dimension of the region 100R remains unchanged.

The region 100E can be isolated from the region 100R by the isolator 36c. However, the E-HEMT of the region 100E can be electrically connected with the resistor of the region 100R through RDLs not depicted in FIG. 5A. In some embodiments, the conductive terminal 32b of the E-HEMT can be electrically connected to the resistor of the region 100R. In some embodiments, the conductive terminal 32c of the E-HEMT can be electrically connected to the resistor of the region 100R. In some embodiments, the gate stack gs1 of the E-HEMT can be electrically connected to the resistor of the region 100R.

Figure 5B:
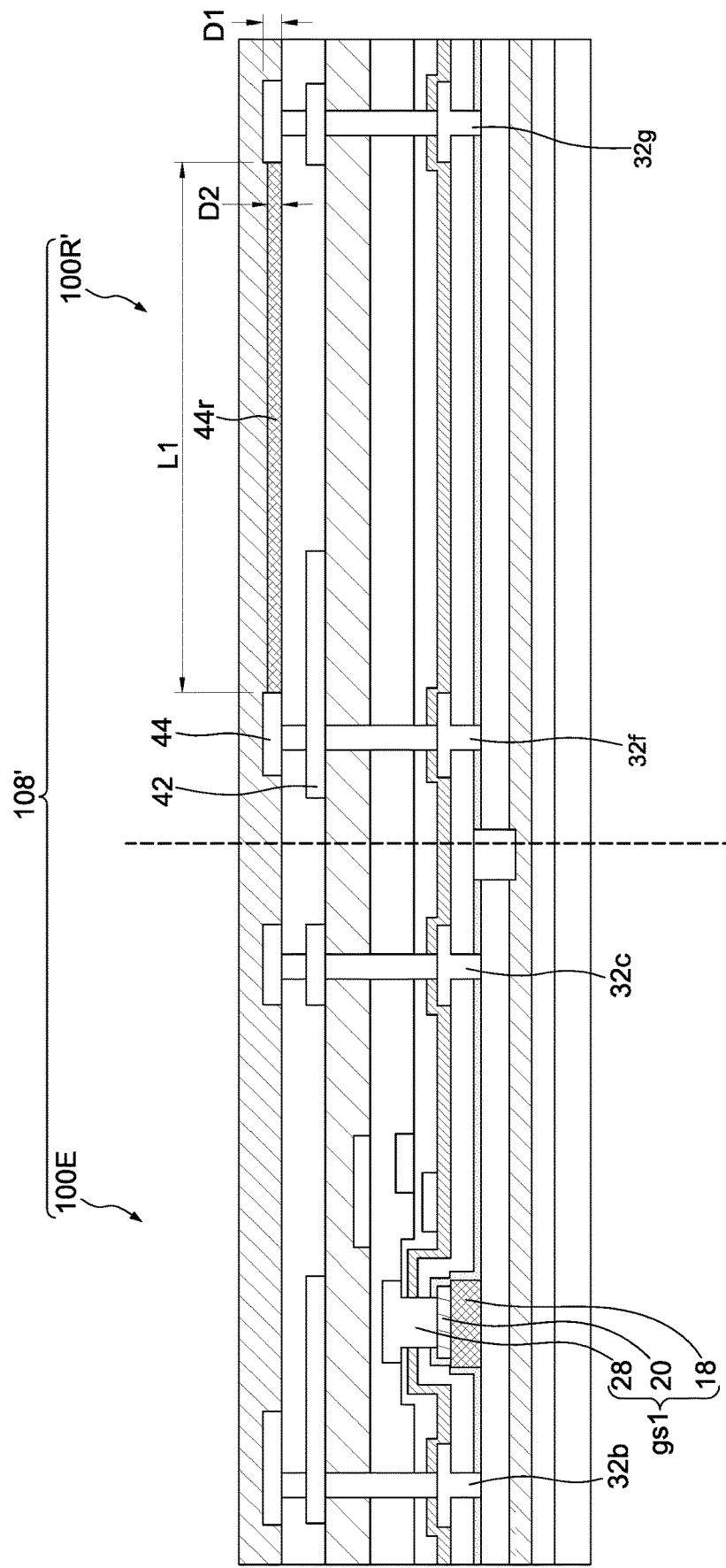
FIG. 5B illustrates a cross-sectional view of a semiconductor device including regions of an active component and a passive component, according to some comparative embodiments of the present disclosure.

FIG. 5B illustrates a cross-sectional view of a semiconductor device including regions of an active component and a passive component, according to some comparative embodiments of the present disclosure.

FIG. 5B shows a cross-sectional view of a semiconductor device 108'. The semiconductor device 108' includes regions 100E and 100R'. The region 100E may include a transistor. The conductive terminals 32b and 32c can be the source/drain of the transistor, and the gate stack gs1 can be the gate of the transistor. The transistor disposed within the region 100E can be an enhancement mode (E-mode) HEMT.

The region 100R' may include a resistor 44r. The resistor 44r can be disposed in the same layer as the RDL 44. In some embodiments, in order to achieve high resistance between the conductive terminals 32f and 32g, the length L1 of the resistor 44r needs to greater than a certain value. In some embodiments, in order to achieve high resistance between the conductive terminals 32f and 32g, the thickness D2 of the resistor 44r needs to be less than a certain value.

The length L1 required to achieve a certain level of resistance may enlarge the dimension of the semiconductor device 108'. The length L1 required to achieve a certain level of resistance may adversely affect the miniaturization of the semiconductor device 108'. Furthermore, due to the thickness D2 being different from the thickness D1, separate steps are required to form the resistor 44r and RDL 44, and as the result, the total cost for manufacturing the semiconductor device 108' may be increased.

Figure 6A:
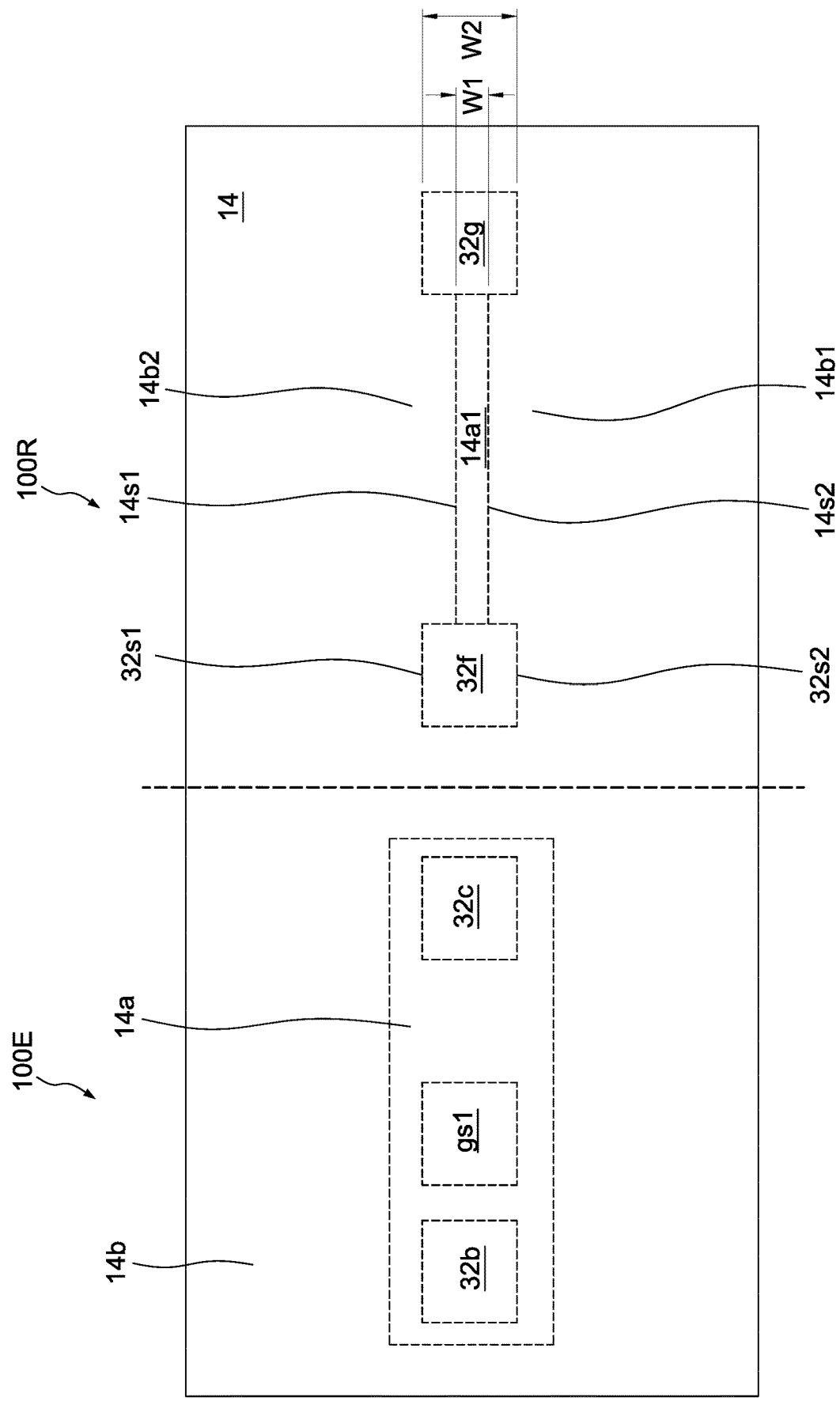
FIG. 6A illustrates a top view of a semiconductor device along the dashed-line C-C' as shown in FIG. 5A, according to some embodiments of the present disclosure.

FIG. 6A illustrates a top view of a semiconductor device along the dashed-line C-C' as shown in FIG. 5A, according to some embodiments of the present disclosure.

The region 100E includes an active region 14a and a doped region 14b. The active region 14a can be the 2DEG region within the nitride semiconductor layer 14. The conductive terminals 32b and 32c and the gate stack gs1 can be located within the active region 14a. The orthographic projections of the conductive terminals 32b and 32c and the gate stack gs1 can be located within the active region 14a. The active region 14a can surround the orthographic projections of the conductive terminals 32b and 32c and the gate stack gs1.

The doped region 14b can be an isolation region. The doped region 14b can be an insulation region. The doped region 14b can be formed by doping, ion-implantation, or diffusion processes.

The region 100R includes a conductive region 14a1 connected between the conductive terminals 32f and 32g.

The conductive region 14a1 can be formed by doping, ion-implantation, or diffusion processes. The resistance of the conductive region 14a1 can be controlled by modifying the types or the amounts of the impurities used during the doping, ion-implantation, or diffusion processes. The conductive region 14a1 can be used as a resistor in the semiconductor device 108.

The conductive region 14a1 can include a width W1 smaller than the width W2 of the conductive terminals 32f and 32g. The edges 14s1 and 14s2 of the conductive region 14a1 can be between the edges 32s1 and 32s2 of the conductive terminal 32f.

The conductive region 14a1 can be located between the conductive terminals 32f and 32g. The conductive region 14a1 can be in contact with the conductive terminals 32f and 32g. A doped region 14b1 can be located between the conductive terminals 32f and 32g. A doped region 14b2 can be located between the conductive terminals 32f and 32g. The doped regions 14b1 and 14b2 can be in contact with the conductive terminals 32f and 32g.

The doped regions 14b1 and 14b2 can be formed by ion implantation. The doped regions 14b1 and 14b2 can be formed in the nitride semiconductor layer 14 by damaging the crystal lattice structure with ion implantation (e.g., implanting nitrogen (N), argon (Ar), boron (B), or phosphorus (P)).

Figure 6B:
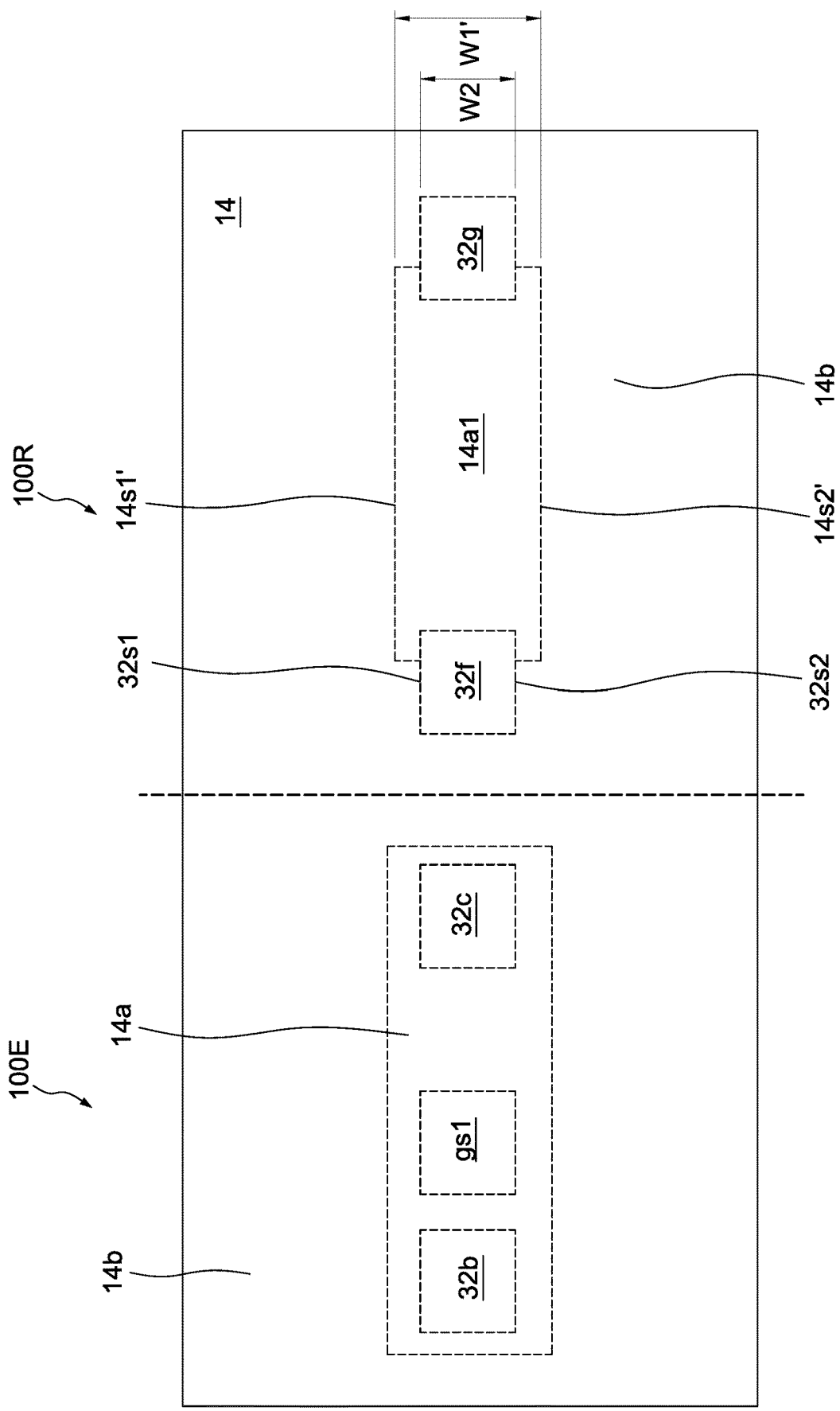
FIG. 6B illustrates a top view of a semiconductor device along the dashed-line C-C' as shown in FIG. 5A, according to some embodiments of the present disclosure.

FIG. 6B illustrates a top view of a semiconductor device along the dashed-line C-C' as shown in FIG. 5A, according to some embodiments of the present disclosure.

The region 100E includes structures and materials similar to those described in accordance with FIG. 6A, and thus the details are not repeated here. The region 100R includes a conductive region 14a1 connected between the conductive terminals 32f and 32g.

The conductive region 14a1 can be formed by doping, ion-implantation, or diffusion processes. The resistance of the conductive region 14a1 can be controlled by modifying the types or the amounts of the impurities used during the doping, ion-implantation, or diffusion processes. The conductive region 14a1 can be used as a resistor in the semiconductor device 108.

The conductive region 14a1 can include a width W1' greater than the width W2 of the conductive terminals 32f and 32g. The edges 32s1 and 32s2 of the conductive terminal 32f can be between the edges 14s1' and 14s2' of the conductive region 14a1.

The conductive region 14a1 can be located between the conductive terminals 32f and 32g. The conductive region 14a1 can be in contact with the conductive terminals 32f and 32g. A portion of the conductive terminal 32f can be surrounded by the conductive region 14a1. A portion of the conductive terminal 32g can be surrounded by the conductive region 14a1. In the embodiment shown in FIG. 6B, no doped region is located between the conductive terminals 32f and 32g.

Figure 6C:
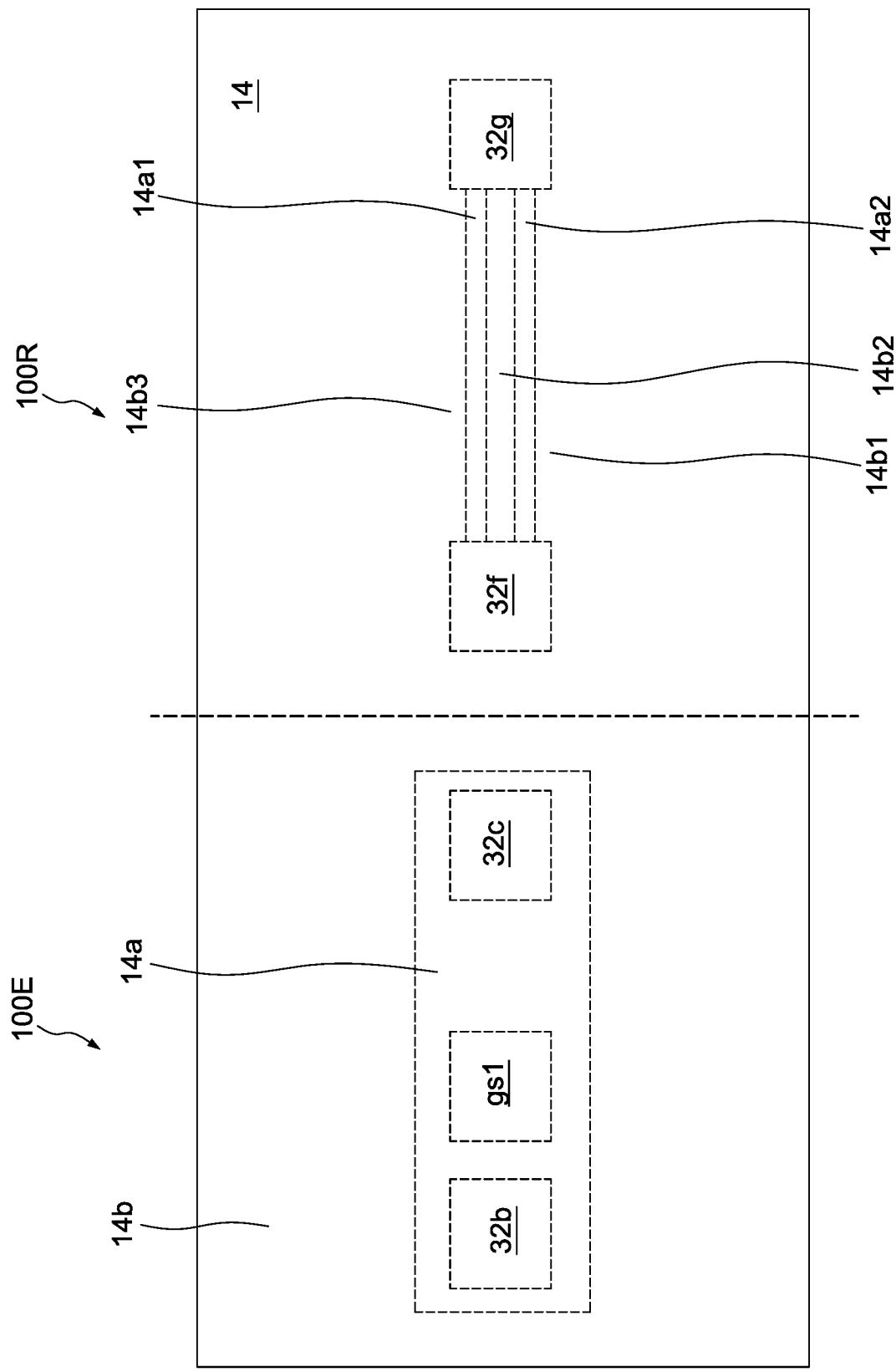
FIG. 6C illustrates a top view of a semiconductor device along the dashed-line C-C' as shown in FIG. 5A, according to some embodiments of the present disclosure.

FIG. 6C illustrates a top view of a semiconductor device along the dashed-line C-C' as shown in FIG. 5A, according to some embodiments of the present disclosure.

The region 100E includes structures and materials similar to those described in accordance with FIG. 6A, and thus the details are not repeated here. The region 100R includes a conductive region 14a1 connected between the conductive terminals 32f and 32g. The region 100R includes a conductive region 14a2 connected between the conductive terminals 32f and 32g.

The conductive regions 14a1 and 14a2 can be formed by doping, ion-implantation, or diffusion processes.

The resistance of the conductive regions 14a1 and 14a2 can be controlled by modifying the types or the amounts of the impurities used during the doping, ion-implantation, or diffusion processes. The conductive regions 14a1 and 14a2 can be used as a resistor in the semiconductor device 108.

The conductive regions 14a1 and 14a2 can be located between the conductive terminals 32f and 32g. The conductive regions 14a1 and 14a2 can be in contact with the conductive terminals 32f and 32g. The conductive region 14a1 can be arranged to be substantially parallel to the conductive region 14a2.

The doped regions 14b1, 14b2 and 14b3 can be isolation regions. The doped regions 14b1, 14b2 and 14b3 can be insulation regions. The doped regions 14b1, 14b2 and 14b3 can be formed by doping, ion-implantation, or diffusion processes. The doped regions 14b1, 14b2 and 14b3 can be in contact with the conductive terminals 32f and 32g. The doped region 14b2 can be disposed between the conductive regions 14a1 and 14a2. The conductive regions 14a1 and 14a2 can be disposed on opposite sides of the doped region 14b2.

Figure 6D:
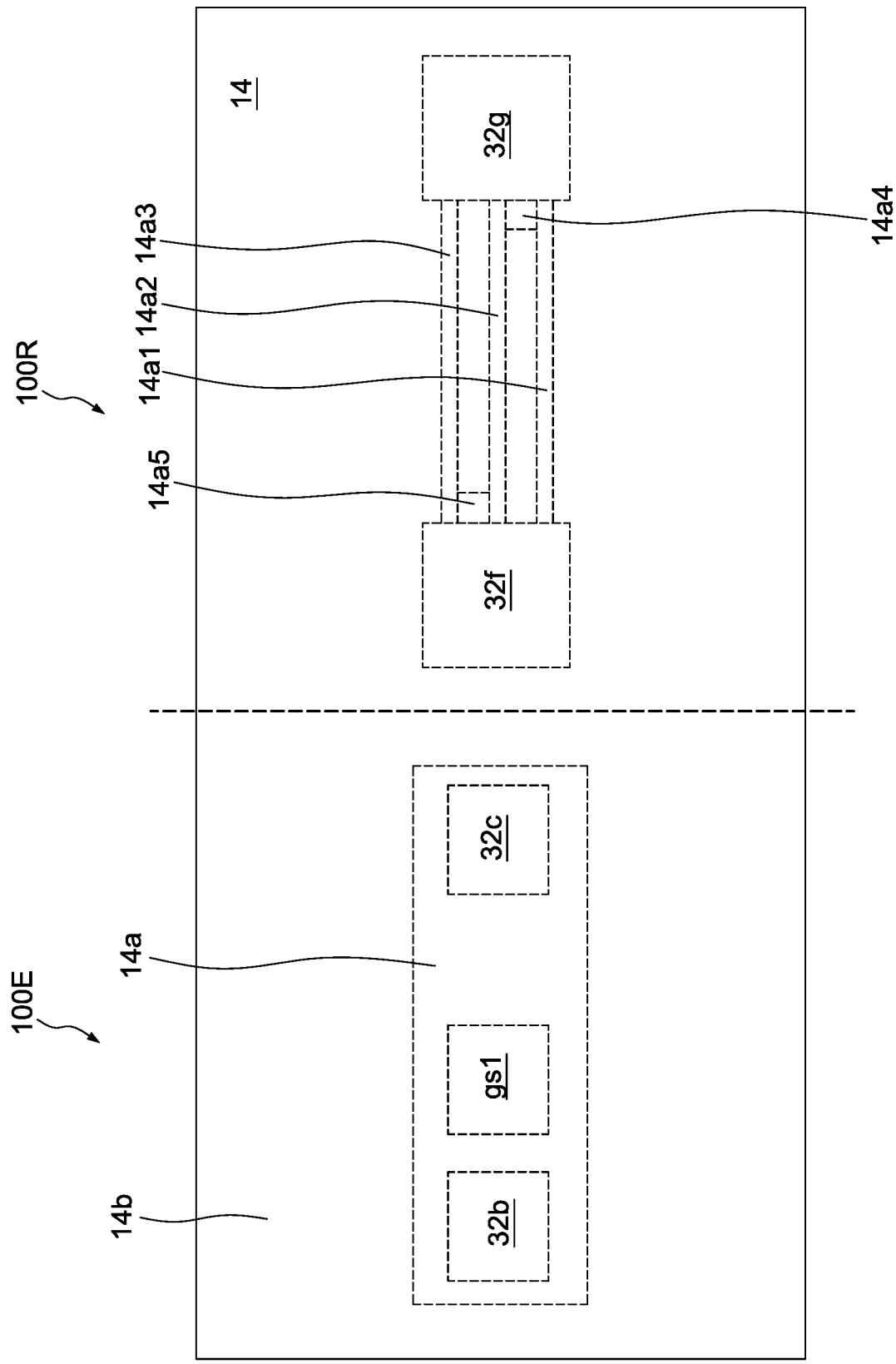
FIG. 6D illustrates a top view of a semiconductor device along the dashed-line C-C' as shown in FIG. 5A, according to some embodiments of the present disclosure.

FIG. 6D illustrates a top view of a semiconductor device along the dashed-line C-C' as shown in FIG. 5A, according to some embodiments of the present disclosure.

The region 100E includes structures and materials similar to those described in accordance with FIG. 6A, and thus the details are not repeated here. The region 100R includes a conductive region 14a1 connected between the conductive terminals 32f and 32g. The region 100R includes a conductive region 14a2 connected between the conductive terminals 32f and 32g. The region 100R includes a conductive region 14a3 connected between the conductive terminals 32f and 32g. The conductive regions 14a1, 14a2 and 14a3 can be arranged to be substantially parallel with each other.

The region 100R includes a conductive region 14a4 connected between the conductive regions 14a1 and 14a2. The region 100R includes a conductive region 14a5 connected between the conductive regions 14a2 and 14a3.

The conductive region 14a4 can be arranged to be substantially perpendicular to the conductive regions 14a1, 14a2 and 14a3. The conductive region 14a5 can be arranged to be substantially perpendicular to the conductive regions 14a1, 14a2 and 14a3.

The conductive regions 14a1, 14a2, 14a3, 14a4 and 14a5 can be formed by doping, ion-implantation, or diffusion processes. The resistance of the conductive regions 14a1, 14a2, 14a3, 14a4 and 14a5 can be controlled by modifying the types or the amounts of the impurities used during the doping, ion-implantation, or diffusion processes. The conductive regions 14a1, 14a2, 14a3, 14a4 and 14a5 can be used as resistors in the semiconductor device 108.

Figure 6E:
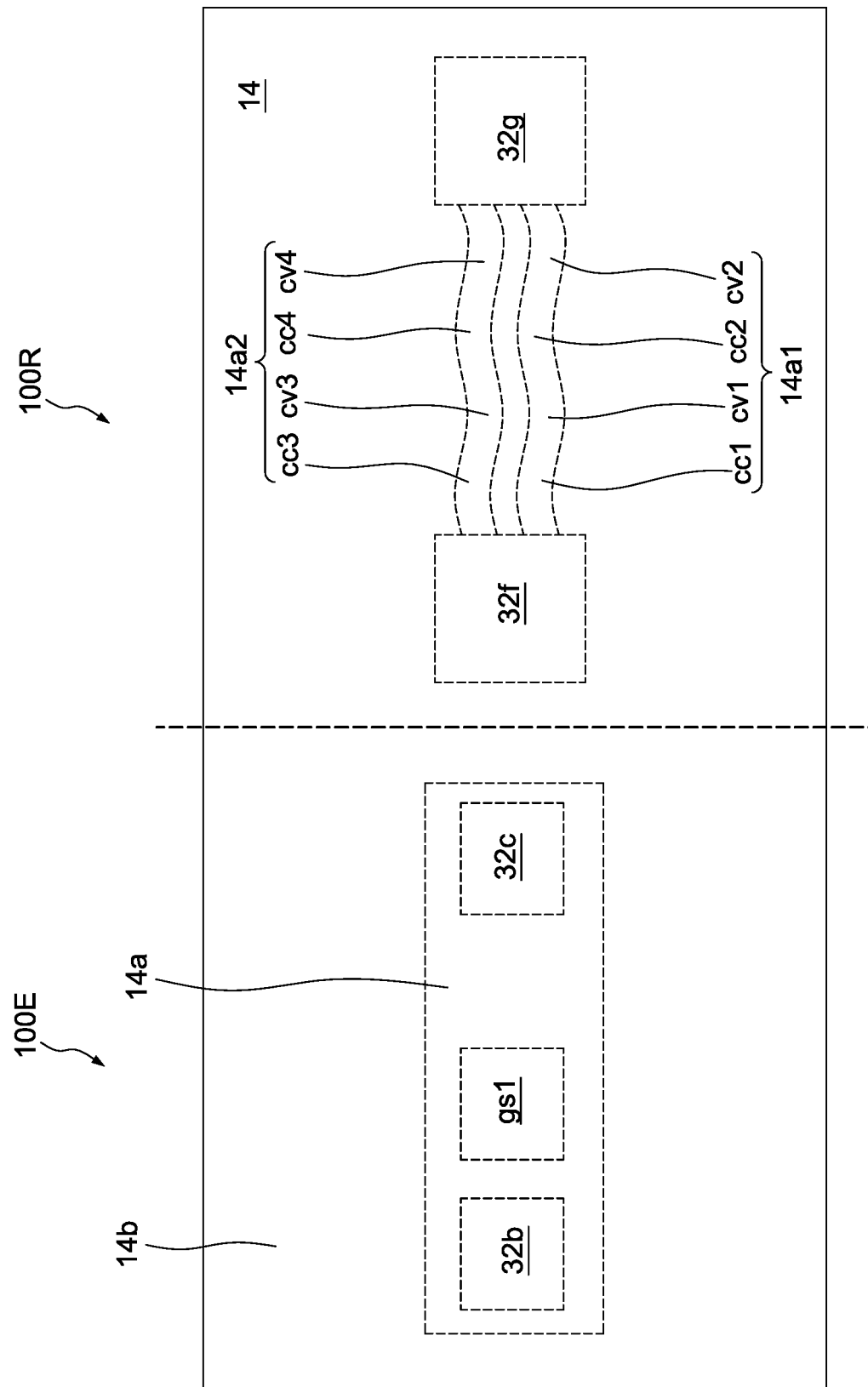
FIG. 6E illustrates a top view of a semiconductor device along the dashed-line C-C' as shown in FIG. 5A, according to some embodiments of the present disclosure.

FIG. 6E illustrates a top view of a semiconductor device along the dashed-line C-C' as shown in FIG. 5A, according to some embodiments of the present disclosure.

The region 100E includes structures and materials similar to those described in accordance with FIG. 6A, and thus the details are not repeated here.

The region 100R includes a conductive region 14a1 connected between the conductive terminals 32f and 32g. The region 100R includes a conductive region 14a2 connected between the conductive terminals 32f and 32g. The conductive region 14a1 includes curved portions. The conductive region 14a2 includes curved portions. In some embodiments, the conductive region 14a1 includes concave portions cc1 and cc2 and convex portions cv1 and cv2. In some embodiments, the conductive region 14a2 includes concave portions cc3 and cc4 and convex portions cv3 and cv4.

In some other embodiments, the conductive region 14a1 may include fewer concave portions or convex portions. In some other embodiments, the conductive region 14a1 may include more than two concave portions or more than two convex portions. In some other embodiments, the conductive region 14a2 may include fewer concave portions or convex portions. In some other embodiments, the conductive region 14a2 may include more than two concave portions or more than two convex portions.

Figure 7C:
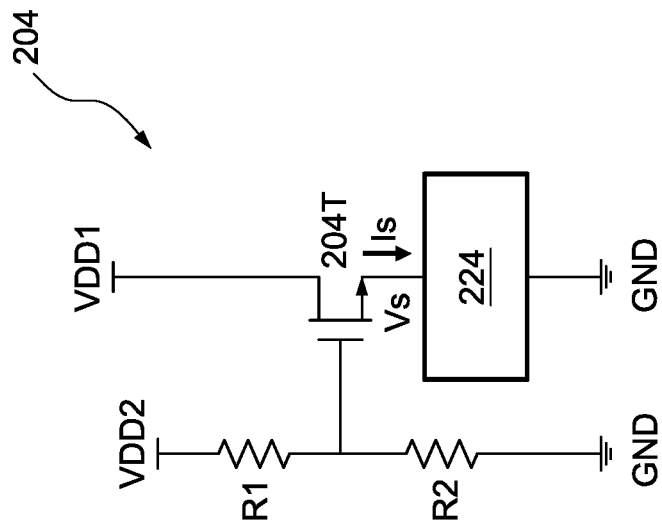
FIG. 7C illustrates a schematic circuit diagram according to some embodiments of the present disclosure.
Figure 7B:
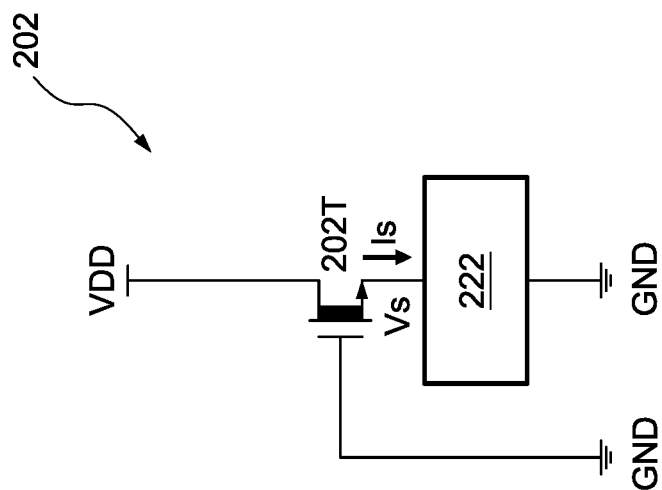
FIG. 7B illustrates a schematic circuit diagram according to some embodiments of the present disclosure.
Figure 7A:
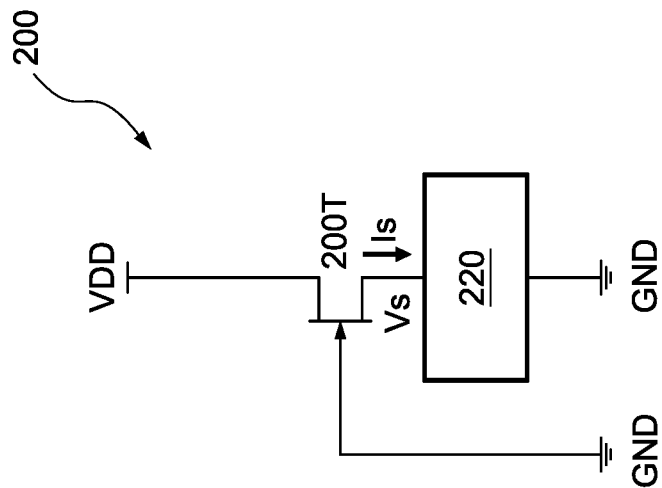
FIG. 7A illustrates a schematic circuit diagram according to some embodiments of the present disclosure.

FIG. 7A illustrates a schematic circuit diagram according to some embodiments of the present disclosure. FIG. 7A shows a circuit 200. The circuit 200 includes a transistor 200T and an application circuit 220. The drain terminal of the transistor 200T is electrically connected to a high voltage source VDD, the gate terminal of the transistor 200T is electrically connected to the ground (GND), and the source terminal of the transistor 200T is electrically connected to the application circuit 220.

The voltage source VDD can be at a level of around 650 Volts, while the application circuit 220 may operate in a relative low voltage range, for example, 10 Volts to 20 Volts. The transistor 200T can convert the high voltage received from the voltage source VDD to the feasible operation range of the application circuit 220.

In some embodiments, the transistor 200T can be a depletion mode (D-mode) metal-insulator-semiconductor (MIS). The transistor 200T may have a threshold voltage Vt ranging from −8 Volts to −20 Volts. When the transistor 200T is in the "normal on" stage, the transistor 200T may provide a current Is in the scale of microamperes (uA) or milliamperes (mA). When the transistor 200T is in the "normal on" stage, the transistor 200T may provide a voltage Vs ranging from 10 Volts to 20 Volts.

The application circuit 220 can be a start-up circuit for mobile phones, satellites, microwave systems or radar systems. The application circuit 220 may include E-HEMTs. The circuit 200 may integrate a D-mode MIS (D-MIS) and an E-HEMT. The semiconductor device 102 described in accordance with FIG. 2A can be applied to the circuit 200. Integration of a D-MIS and an E-HEMT may enhance the performance of the circuit 200. Integration of a D-MIS and an E-HEMT may facilitate the miniaturization of the circuit 200.

FIG. 7B illustrates a schematic circuit diagram according to some embodiments of the present disclosure. FIG. 7B shows a circuit 202. The circuit 202 includes a transistor 202T and an application circuit 222. The drain terminal of the transistor 202T is electrically connected to a high voltage source VDD, the gate terminal of the transistor 202T is electrically connected to the ground (GND), and the source terminal of the transistor 202T is electrically connected to the application circuit 222.

The voltage source VDD can be at a level of around 650 Volts, while the application circuit 222 may operate in a relative low voltage range, for example, 0 Volt to 8 Volts. The transistor 202T can convert the high voltage received from the voltage source VDD to the feasible operation range of the application circuit 222.

In some embodiments, the transistor 202T can be a depletion mode (D-mode) HEMT (D-HEMT). The transistor 202T may have a threshold voltage Vt ranging from 0 Volt to −8 Volts. When the transistor 202T is in the "normal on" stage, the transistor 202T may provide a current Is in the scale of microamperes (uA) or milliamperes (mA). When the transistor 202T is in the "normal on" stage, the transistor 202T may provide a voltage Vs ranging from 0 Volt to 8 Volts.

The application circuit 222 can be a start-up circuit for mobile phones, satellites, microwave systems or radar systems. The application circuit 222 may include E-HEMTs. The circuit 202 may integrate a D-HEMT and an E-HEMT. The semiconductor device 104 as described in accordance with FIG. 3 can be applied to the circuit 202. Integration of a D-HEMT and an E-HEMT may enhance the performance of the circuit 202. Integration of a D-HEMT and an E-HEMT may facilitate the miniaturization of the circuit 202.

FIG. 7C illustrates a schematic circuit diagram according to some embodiments of the present disclosure. FIG. 7C shows a circuit 204. The circuit 204 includes a transistor 204T, an application circuit 224, and resistors R1 and R2.

The drain terminal of the transistor 204T is electrically connected to a high voltage source VDD1. The gate terminal of the transistor 204T is electrically connected to a voltage source VDD2 through the resistor R1. The gate terminal of the transistor 204T is electrically connected to the ground (GND) through the resistor R2. The source terminal of the transistor 204T is electrically connected to the application circuit 224.

The voltage source VDD1 can be at a level of around 650 Volts, while the application circuit 224 may operate in a relative low voltage range, for example, 0.1 Volt to 40 Volts. The transistor 204T can convert the high voltage received from the voltage source VDD1 to the feasible operation range of the application circuit 224.

In some embodiments, the transistor 204T can be an E-HEMT. The transistor 204T may have a threshold voltage Vt ranging from 1 Volt to 2.5 Volts. The resistors R1 and R2 can be a voltage divider that provides a feasible voltage to the gate terminal of the transistor 204T. When the transistor 204T is in the "normal on" stage, the transistor 204T may provide a current Is in the scale of microamperes (uA) or milliamperes (mA). When the transistor 204T is in the "normal on" stage, the transistor 204T may provide a voltage Vs ranging from 0.1 Volt to 40 Volts.

The application circuit 224 can be a start-up circuit for mobile phones, satellites, microwave systems or radar systems. The application circuit 224 may include E-HEMTs. The circuit 204 may integrate E-HEMTs and resistors. The semiconductor device 108 described in accordance with FIG. 5A can be applied to the circuit 204. Integration of E-HEMTs and resistors may enhance the performance of the circuit 204. Integration of E-HEMTs and resistors may facilitate the miniaturization of the circuit 204.

Figure 8A:
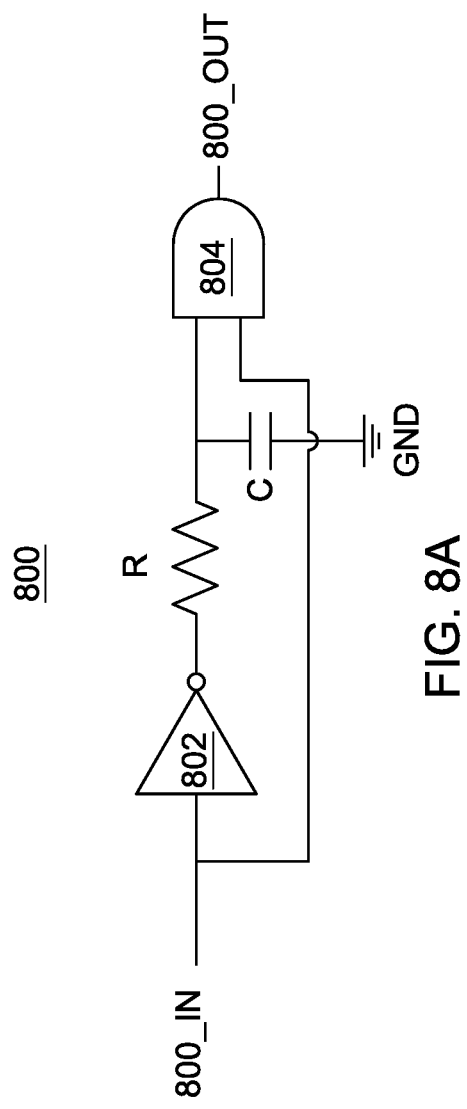
FIG. 8A illustrates a schematic circuit diagram according to some embodiments of the present disclosure.

FIG. 8A illustrates a schematic circuit diagram according to some embodiments of the present disclosure. FIG. 8A shows a pulse generating circuit 800. The pulse generating circuit 800 includes an input terminal 800_IN and an output terminal 800_OUT. The pulse generating circuit 800 includes logical circuits 802 and 804. The pulse generating circuit 800 includes resistor R connected between the logical circuits 802 and 804. The pulse generating circuit 800 includes a capacitor C connected between the resistor R and the ground (GND).

The logical circuits 802 and 804 can be implemented with various types of transistors. The types of transistors may include, for example, E-HEMT, D-HEMT, D-MIS, E-MIS, P-type metal-oxide-semiconductor (PMOS), n-type metal-oxide-semiconductor (NMOS), or any suitable transistors of other types.

The semiconductor devices 100, 102, 104, 106 and 108 described in accordance with FIGS. 1, 2A, 3, 4 and 5A can be applied to the pulse generating circuit 800. Integration of various types of transistors and passive components (such as resistors and capacitors) may enhance the performance of the pulse generating circuit 800. Integration of various types of transistors and passive components (such as resistors and capacitors) may facilitate the miniaturization of the pulse generating circuit 800.

Figure 8B:
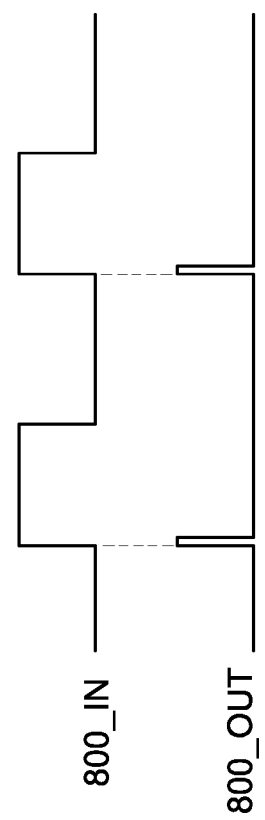
FIG. 8B illustrates waveforms of a pulse generating circuit according to some embodiments of the present disclosure.

FIG. 8B illustrates waveforms of a pulse generating circuit according to some embodiments of the present disclosure. FIG. 8B shows the waveforms of the input terminal 800_IN and the output terminal 800_OUT of the pulse generating circuit 800. The pulse generating circuit 800 may receive a periodic square signal from the input terminal 800_IN, and then provide a periodic pulse signal at the output terminal 800_OUT.

FIGS. 9A, 9B, 9C, 9D, 9E and 9F illustrate operations for fabricating a semiconductor device according to some embodiments of the present disclosure. The operations shown in FIGS. 9A, 9B, 9C, 9D, 9E and 9F can be performed in the manufacture of the semiconductor device 102 shown in FIG. 2A.

Figure 9A:
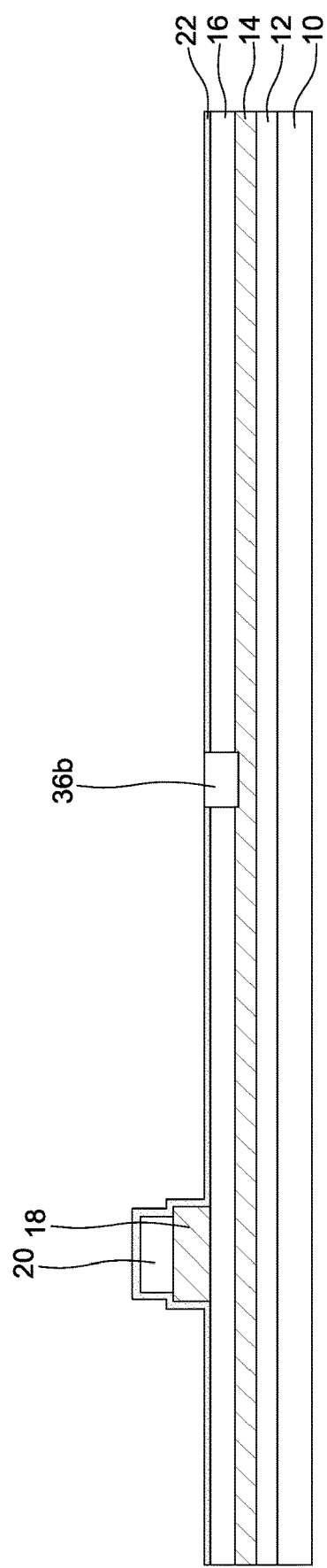

Referring to FIG. 9A, a substrate 10 is provided. In some embodiments, the substrate 10 may include a silicon material or sapphire. Next, a buffer layer 12 is formed on the substrate 10, a nitride semiconductor layer 14 is formed on the buffer layer 12, and a nitride semiconductor layer 16 is formed on the nitride semiconductor layer 14. A semiconductor gate 18 is formed in contact with the nitride semiconductor layer 16, and a gate conductor 20 is formed in contact with the semiconductor gate 18. The semiconductor gate 18 can be a doped nitride semiconductor layer formed before the gate conductor 20 is formed.

A passivation layer 22 is formed to cover the semiconductor gate 18, the gate conductor 20, and the nitride semiconductor layer 16. An isolator 36b can be located within the nitride semiconductor layer 14, and divides the semiconductor structure into two regions. In some embodiments, the buffer layer 12, the nitride semiconductor layer 14, the nitride semiconductor layer 16, and the passivation layer 22 may be formed by chemical vapor deposition (CVD), physical vapor deposition (PVD), epitaxial growth, or other suitable deposition processes.

Figure 9B:
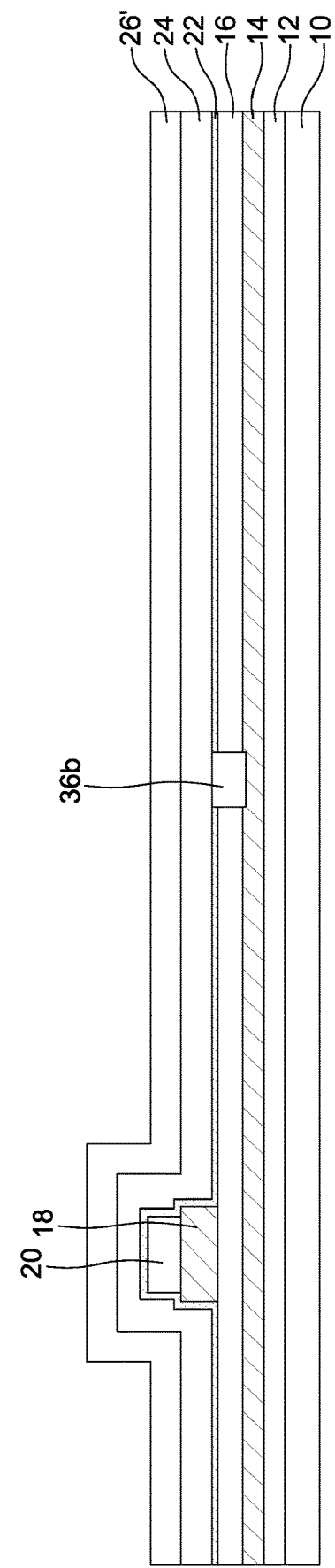

Referring to FIG. 9B, a dielectric layer 24 can be formed conformally on the passivation layer 22. A gate material layer 26' can be formed conformally on the dielectric layer 24.

The gate material layer 26' may include titanium nitride (TiN). The thickness of the gate material layer 26' can be, for example, about 200 nm. The gate material layer 26' can include other conductive materials. In some embodiments, the gate material layer 26' can include polycrystal silicon doped with an impurity such as boron (B) or phosphorus (P). In some embodiments, the gate material layer 26' can include Ti, Al, Ni, or Au. Further, the gate material layer 26' can include a metal compound comprising, for example, Ti, Al, Ni, and Au and Si (metal silicide). Further, the gate material layer 26' can include a metal nitride comprising, for example, Ti, Al, Ni, and Au.

Referring to FIG. 9C, a gate conductor 26 can be formed by removing specific portions of the gate material layer 26'. In some embodiments, the gate material layer 26' may be patterned by dry etching. In some embodiments, the gate material layer 26' may be patterned by wet etching. The etching process conducted on the gate material layer 26' may stop on the top surface of the dielectric layer 24. The etching process conducted on the gate material layer 26' may continue until the top surface of the dielectric layer 24 is exposed.

Referring to FIG. 9D, conductive terminals 32b, 32c, 32d and 32e can be formed. A conductive layer can be formed on the dielectric layer 24, and then the conductive layer can be patterned so as to form the conductive terminals 32b, 32c, 32d and 32e. The conductive terminals 32b and 32c can be formed on the same side of the isolator 36b. The conductive terminals 32d and 32e can be formed on the same side of the isolator 36b. The conductive terminals 32b, 32c, 32d and 32e can be in contact with the nitride semiconductor layer 16.

Figure 9E:
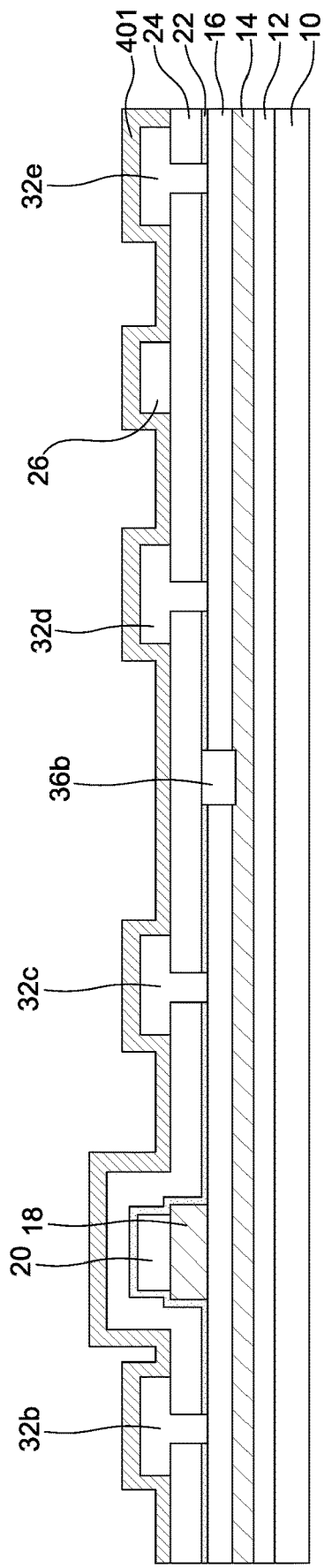

Referring to FIG. 9E, a dielectric layer 401 can be formed to cover the dielectric layer 24, the conductive terminals 32b, 32c, 32d and 32e, and the gate conductor 26. The dielectric layer 401 can be conformally formed on the dielectric layer 24, the conductive terminals 32b, 32c, 32d and 32e, and the gate conductor 26. The dielectric layer 401 may be formed by CVD, PVD, epitaxial growth, or other suitable deposition processes.

Figure 9F:
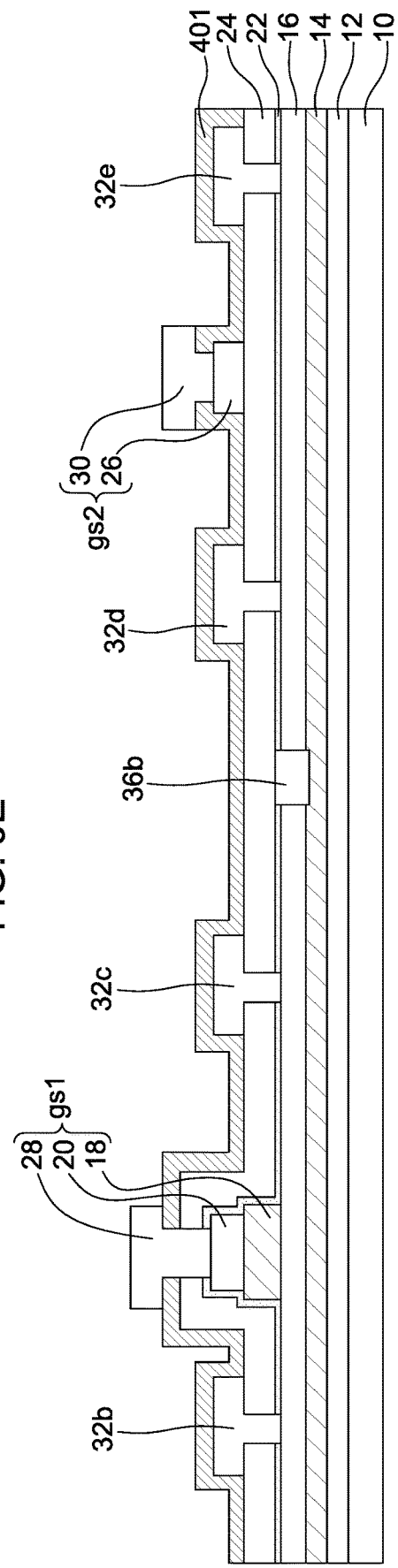

Referring to FIG. 9F, a gate conductor 28 can be formed in contact with the gate conductor 20, and a gate conductor 30 can be formed in contact with the gate conductor 26. A gate stack gs1 may comprise the gate conductor 28, the gate conductor 20 and the semiconductor gate 18. A gate stack gs2 may comprise the gate conductor 30 and the gate conductor 26.

Figure 10A:
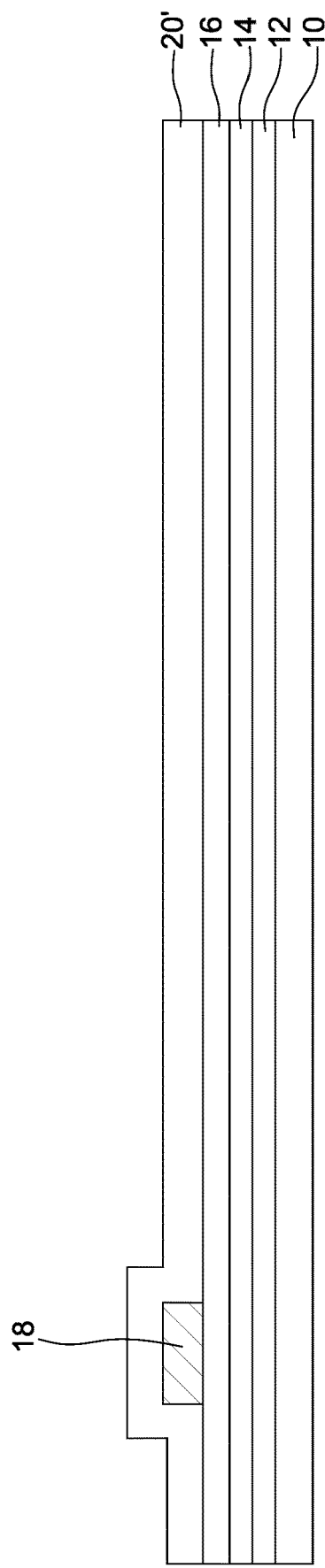
FIGS. 10A, 10B and 10C illustrate operations for fabricating a semiconductor device, according to some embodiments of the present disclosure.
Figure 10B:
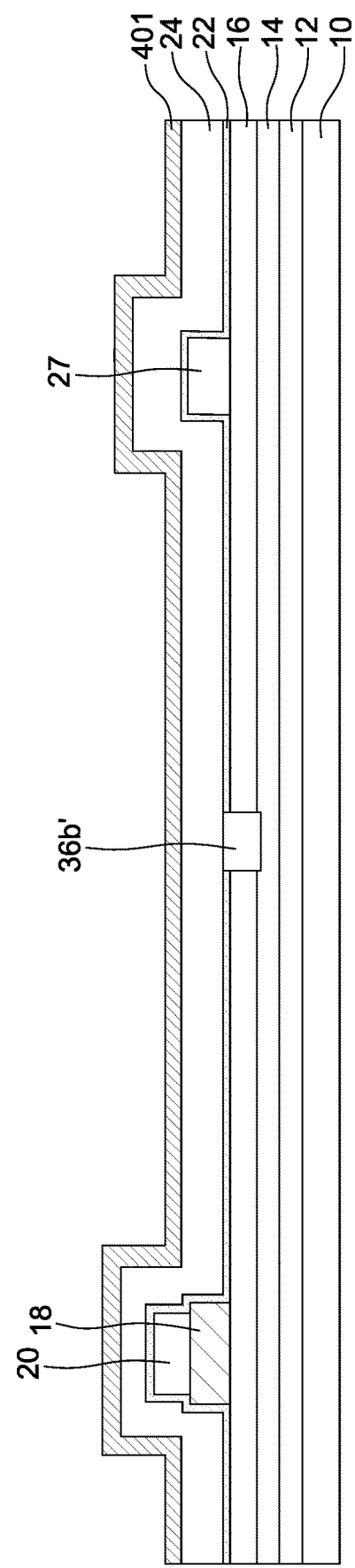
Figure 10C:
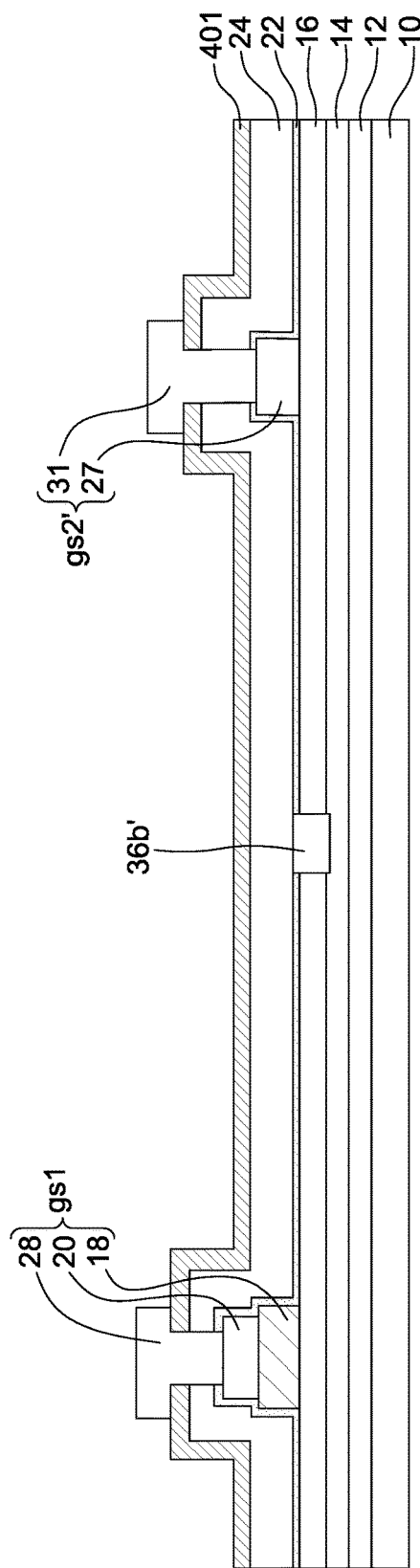

FIGS. 10A, 10B and 10C illustrate operations for fabricating a semiconductor device, according to some embodiments of the present disclosure. The operations shown in FIGS. 10A, 10B and 10C can be performed in the manufacturing of the semiconductor device 104 shown in FIG. 3.

Referring to FIG. 10A, a substrate 10 is provided. In some embodiments, the substrate 10 may include a silicon material or sapphire. Next, a buffer layer 12 is formed on the substrate 10, a nitride semiconductor layer 14 is formed on the buffer layer 12, and a nitride semiconductor layer 16 is formed on the nitride semiconductor layer 14. A semiconductor gate 18 is formed in contact with the nitride semiconductor layer 16. A gate material layer 20' can be formed conformally on the semiconductor gate 18 and the nitride semiconductor layer 16. The gate material layer 20' can cover the semiconductor gate 18 and the nitride semiconductor layer 16.

Referring to FIG. 10B, the gate material layer 20' can be patterned and then the gate conductors 20 and 27 can be formed. A passivation layer 22 can be formed conformally on the semiconductor gate 18, the gate conductor 20 and the nitride semiconductor layer 16. An isolator 36b' can be formed between the gate conductors 20 and 27. The isolator 36b' can disconnect the 2DEG within the nitride semiconductor layer 14.

Dielectric layers 24 and 401 can be formed conformally on the semiconductor gate 18, the gate conductor 20 and the nitride semiconductor layer 16. Dielectric layers 24 and 401 can be formed conformally on the passivation layer 22.

Referring to FIG. 10C, a gate conductor 28 can be formed in contact with the gate conductor 20, and a gate conductor 31 can be formed in contact with the gate conductor 27. A gate stack gs1 may comprise the gate conductor 28, the gate conductor 20 and the semiconductor gate 18. A gate stack gs2' may comprise the gate conductor 31 and the gate conductor 27.

Figure 11A:
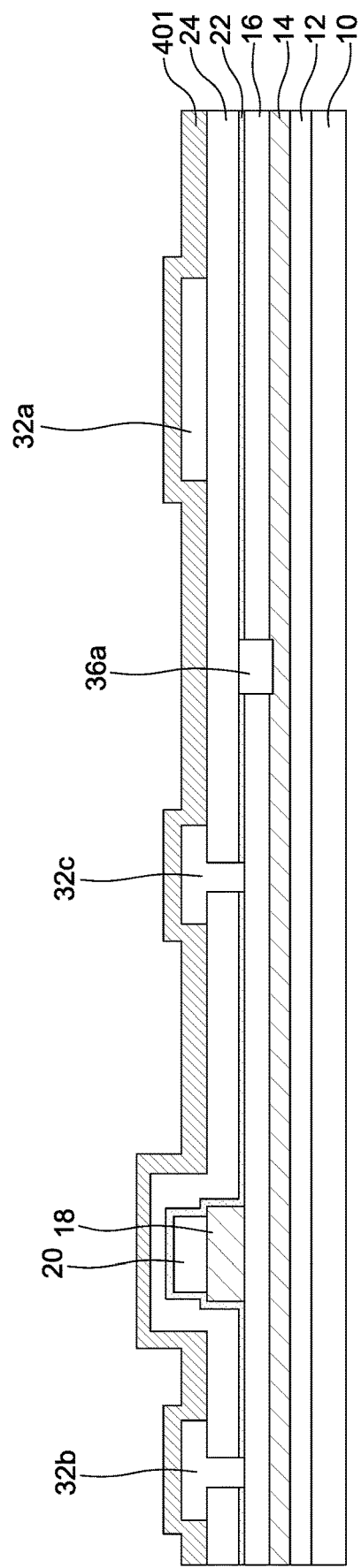

FIGS. 11A, 11B and 11C illustrate operations for fabricating a semiconductor device, according to some embodiments of the present disclosure. The operations shown in FIGS. 11A, 11B and 11C can be performed in the manufacture of the semiconductor device 106 shown in FIG. 4.

Referring to FIG. 11A, a substrate 10 is provided. In some embodiments, the substrate 10 may include a silicon material or sapphire. Next, a buffer layer 12 is formed on the substrate 10, a nitride semiconductor layer 14 is formed on the buffer layer 12, and a nitride semiconductor layer 16 is formed on the nitride semiconductor layer 14. A semiconductor gate 18 is formed in contact with the nitride semiconductor layer 16. A gate conductor 20 is formed in contact with the semiconductor gate 18.

A passivation layer 22 can be formed conformally on the semiconductor gate 18, the gate conductor 20 and the nitride semiconductor layer 16. A dielectric layer 24 can be formed conformally on the passivation layer 22. An isolator 36a can be formed within the nitride semiconductor 16. The isolator 36a can disconnect the 2DEG within the nitride semiconductor layer 14.

A conductive layer 32a and conductive terminals 32b and 32c can be formed at the same time. The conductive layer 32a can be formed on the dielectric layer 24. The conductive terminals 32b and 32c can be formed within the openings of the dielectric layer 24. The conductive terminals 32b and 32c can be in contact with the nitride semiconductor layer 16. After the conductive layer 32a and conductive terminals 32b and 32c are formed, a dielectric layer 401 can be formed conformally on the conductive terminal 32b, the dielectric layer 24, the conductive terminal 32c and the conductive layer 32a.

Referring to FIG. 11B, conductive layers 34a1 and 34a2 can be formed on the dielectric layer 401. The conductive layers 34a1 and 34a2 may be formed by chemical CVD, PVD, epitaxial growth, or other suitable deposition processes. The conductive layers 34a1 and 34a2 can be formed at the same time. The conductive layers 34a1 and 34a2 can include identical materials.

Referring to FIG. 11C, a dielectric layer 403 can be formed to cover the dielectric layer 401 and the conductive layers 34a1 and 34a2. The dielectric layer 403 can have a substantially planar top surface. Conductive layers 34b1 and 34b2 can be formed on the dielectric layer 403. The conductive layers 34b1 and 34b2 may be formed by chemical CVD, PVD, epitaxial growth, or other suitable deposition processes. The conductive layers 34b1 and 34b2 can be formed at the same time. The conductive layers 34b1 and 34b2 can include identical materials. A gate conductor 28 can be formed in contact with the gate conductor 20. A gate stack gs1 may comprise the gate conductor 28, the gate conductor 20 and the semiconductor gate 18.

FIGS. 12A and 12B illustrate operations for fabricating a semiconductor device, according to some comparative embodiments of the present disclosure. The operations shown in FIGS. 12A and 12B can be performed in the manufacture of the semiconductor device 108 shown in FIG. 5A.

Referring to FIG. 12A, a substrate 10 is provided. In some embodiments, the substrate 10 may include a silicon material or sapphire. Next, a buffer layer 12 is formed on the substrate 10, a nitride semiconductor layer 14 is formed on the buffer layer 12, and a nitride semiconductor layer 16 is formed on the nitride semiconductor layer 14. A passivation layer 22 can be formed conformally on the nitride semiconductor layer 16. A dielectric layer 24 can be formed conformally on the passivation layer 22.

Conductive terminals 32b, 32c, 32f and 32g can be formed at the same time. Conductive terminals 32b, 32c, 32f and 32g can be in contact with the nitride semiconductor layer 16. A dielectric layer 401 can be formed conformally on the dielectric layer 24 and the conductive terminals 32b, 32c, 32f and 32g.

Referring to FIG. 12B, a resistor can be formed in the dotted-rectangle B. The resistor within the dotted-rectangle B can be electrically connected between the conductive terminals 32f and 32g.

The resistor within the dotted-rectangle B can be formed by doping impurities into the nitride semiconductor layer 14. The resistor within the dotted-rectangle B can be formed by ion implantation. The resistor within the dotted-rectangle B can be formed in the nitride semiconductor layer 14 by damaging the crystal lattice structure with ion implantation (e.g., implanting nitrogen (N), argon (Ar), boron (B), or phosphorus (P)).

An insulator 36c can also be formed by ion implantation. The insulator 36c can be formed between the conductive terminals 32c and 32f. The insulator 36c can disconnect the 2DEG within the nitride semiconductor layer 14.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
a substrate;
a first nitride semiconductor layer disposed on the substrate;
a second nitride semiconductor layer disposed on the first nitride semiconductor layer and having a bandgap greater than that of the first nitride semiconductor layer;
a first gate conductor disposed on a first region of the second nitride semiconductor layer;
a passivation layer covering the first gate conductor;
a second gate conductor disposed on the passivation layer and on a second region of the second nitride semiconductor layer; and
an isolator disposed within the second nitride semiconductor layer and isolating the first region from the second region,
wherein the first region is laterally spaced apart from the second region.

2. The semiconductor device according to claim 1, wherein the first gate conductor and second gate conductor are disposed at opposite sides of the passivation layer.

3. The semiconductor device according to claim 1, wherein the passivation layer is disposed between the second gate conductor and the second nitride semiconductor layer.

4. The semiconductor device according to claim 1, further comprising a third gate conductor disposed on the first gate conductor and a fourth gate conductor disposed on the second gate conductor, wherein the third gate conductor and the fourth gate conductor have the same material.

5. The semiconductor device according to claim 1, further comprising:
a first electrode disposed on the second region of the second nitride semiconductor layer; and
a capacitor disposed on a third region of the second nitride semiconductor layer, wherein the third region is laterally spaced apart from the first region or the second region.

6. The semiconductor device according to claim 5, wherein a first conductive layer of the capacitor and the first electrode have the same material.

7. The semiconductor device according to claim 1, further comprising:

a second electrode disposed on the first region of the second nitride semiconductor layer;
a second conductive layer disposed between the second electrode and the first gate conductor; and
a capacitor disposed on a third region of the second nitride semiconductor layer, wherein the third region is laterally spaced apart from the first region or the second region.

8. The semiconductor device according to claim 7, wherein a third conductive layer of the capacitor and the second conductive layer have the same material.

9. A semiconductor device, comprising:
a substrate;
a first nitride semiconductor layer disposed on the substrate;
a second nitride semiconductor layer disposed on the first nitride semiconductor layer and having a bandgap greater than that of the first nitride semiconductor layer;
a first transistor comprising a first gate conductor, a first drain electrode and a first source electrode;
a second transistor comprising a second gate conductor, a second drain electrode and a second source electrode;
a passivation layer, wherein the first gate conductor and the second gate conductor are disposed at opposite sides of the passivation layer; and
an isolator disposed within the second nitride semiconductor layer and isolating the first transistor from the second transistor.

10. The semiconductor device according to claim 9, wherein the first gate conductor is disposed under the passivation layer and the second gate conductor is disposed on the passivation layer.

11. The semiconductor device according to claim 9, wherein the passivation layer is disposed between the second gate conductor and the second nitride semiconductor layer.

12. The semiconductor device according to claim 9, wherein the first transistor further comprises a third gate conductor disposed on the first gate conductor, and the second transistor further comprises a fourth gate conductor disposed on the second gate conductor, wherein the third gate conductor and the fourth gate conductor have the same material.

13. The semiconductor device according to claim 9, further comprising:
a capacitor comprising a first conductive layer and a second conductive layer,
wherein the first conductive layer and the second drain electrode of the second transistor have the same material.

14. The semiconductor device according to claim 13, wherein the first conductive layer and the second drain electrode are both disposed directly on a same passivation layer.

15. The semiconductor device according to claim 13, wherein the first transistor further comprises a third conductive layer disposed between the first gate conductor and the first drain electrode, and the second conductive layer and the third conductive layer have the same material.

16. The semiconductor device according to claim 15, wherein the second conductive layer and the third conductive layer are both disposed directly on a same passivation layer.

17. A method for fabricating a semiconductor device, comprising:
forming a semiconductor structure having a substrate, a channel layer and a barrier layer;

forming an isolator within the barrier layer, wherein a first region of the barrier layer and a second region of the barrier layer is isolated by the isolator;

forming a first gate conductor on the first region of the barrier layer;

forming a first dielectric layer covering the first gate conductor; and forming a second gate conductor on the first dielectric layer and on the second region of the barrier layer, which is laterally spaced apart from the first region.

18. The method of claim 17, further comprising:

forming a conductive layer on the first dielectric layer; and patterning the conductive layer so as to form a first electrode on a first side of the first gate conductor, a second electrode on a second side of the first gate conductor, a third electrode on a first side of the second gate conductor and a fourth electrode on a second side of the second gate conductor.

19. The method of claim 18, further comprising:

forming a doped nitride semiconductor layer before forming the first gate conductor.

20. The method of claim 18, further comprising: forming a second dielectric layer covering the second gate conductor, the first electrode, the second electrode, the third electrode, and the fourth electrode.

* * * * *